United States Patent
Kondakova et al.

(10) Patent No.: US 8,147,989 B2
(45) Date of Patent: Apr. 3, 2012

(54) OLED DEVICE WITH STABILIZED GREEN LIGHT-EMITTING LAYER

(75) Inventors: Marina E. Kondakova, Kendall, NY (US); Kevin P. Klubek, West Henrietta, NY (US); Margaret J. Helber, Webster, NY (US); Peter G. Bessey, Clifton Springs, NY (US); J. Ramon Vargas, Webster, NY (US); Michele L. Ricks, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 411 days.

(21) Appl. No.: 12/394,935

(22) Filed: Feb. 27, 2009

(65) Prior Publication Data

US 2010/0219748 A1    Sep. 2, 2010

(51) Int. Cl.
*H01L 51/50* (2006.01)
(52) U.S. Cl. ........ 428/690; 428/917; 313/504; 313/505; 313/506; 257/40; 257/E51.05
(58) Field of Classification Search .................. 428/690, 428/917; 257/40, E51.05; 313/504, 505, 313/506
See application file for complete search history.

(56) References Cited

U.S. PATENT DOCUMENTS

| | | |
|---|---|---|
| 3,172,862 A | 3/1965 | Gurnee et al. |
| 3,173,050 A | 3/1965 | Gurnee |
| 3,180,730 A | 4/1965 | Klupfel et al. |
| 3,567,450 A | 3/1971 | Brantly et al. |
| 3,658,520 A | 4/1972 | Brantly et al. |
| 3,710,167 A | 1/1973 | Dresner et al. |
| 4,356,429 A | 10/1982 | Tang |
| 4,539,507 A | 9/1985 | Vanslyke et al. |
| 4,720,432 A | 1/1988 | Vanslyke et al. |
| 4,768,292 A | 9/1988 | Manzei et al. |
| 4,769,292 A | 9/1988 | Tang et al. |
| 4,885,211 A | 12/1989 | Tang et al. |
| 4,885,221 A | 12/1989 | Tsuneeda et al. |
| 5,059,861 A | 10/1991 | Littman et al. |
| 5,059,862 A | 10/1991 | Vanslyke et al. |
| 5,061,569 A | 10/1991 | Vanslyke et al. |
| 5,121,029 A | 6/1992 | Hosokawa et al. |
| 5,141,671 A | 8/1992 | Bryan et al. |

(Continued)

FOREIGN PATENT DOCUMENTS

EP    681 019    11/1995

(Continued)

OTHER PUBLICATIONS

Electroluminescence of doped organic thin films, C.W. Tang, S.A. Vanslyke, and C.H. Chen, J. Appl. Phys. 65 (9), May 1, 1989, pp. 3610-3616.

(Continued)

*Primary Examiner* — Jennifer Chriss
*Assistant Examiner* — Gregory Clark
(74) *Attorney, Agent, or Firm* — McKenna Long & Adridge LLP

(57) ABSTRACT

The invention provides an OLED device including an anode, a cathode and a green light-emitting layer located therebetween, said light-emitting layer including an anthracene host, a bis-diarylamine 9,10-substituted anthracene and a stabilizer compound which is selected from a quinacridone or a biphenylstyrylamine. Devices of the invention provide improvement in features such as stability and efficiency while maintaining excellent color.

18 Claims, 3 Drawing Sheets

U.S. PATENT DOCUMENTS

| | | | |
|---|---|---|---|
| 5,150,006 A | 9/1992 | Van Slyke et al. | |
| 5,151,629 A | 9/1992 | Van Slyke et al. | |
| 5,247,190 A | 9/1993 | Friend et al. | |
| 5,276,380 A | 1/1994 | Tang | |
| 5,294,870 A | 3/1994 | Tang et al. | |
| 5,405,709 A | 4/1995 | Littman et al. | |
| 5,409,783 A | 4/1995 | Tang et al. | |
| 5,484,922 A | 1/1996 | Moore et al. | |
| 5,552,678 A | 9/1996 | Tang et al. | |
| 5,554,450 A | 9/1996 | Shi et al. | |
| 5,593,788 A | 1/1997 | Shi et al. | |
| 5,608,287 A | 3/1997 | Hung et al. | |
| 5,645,948 A | 7/1997 | Shi et al. | |
| 5,677,572 A | 10/1997 | Hung et al. | |
| 5,683,823 A | 11/1997 | Shi et al. | |
| 5,688,551 A | 11/1997 | Littman et al. | |
| 5,703,436 A | 12/1997 | Forrest et al. | |
| 5,714,838 A | 2/1998 | Haight et al. | |
| 5,739,545 A | 4/1998 | Guha et al. | |
| 5,755,999 A | 5/1998 | Shi et al. | |
| 5,759,444 A | 6/1998 | Enokida et al. | |
| 5,766,779 A | 6/1998 | Shi et al. | |
| 5,776,622 A | 7/1998 | Hung et al. | |
| 5,776,623 A | 7/1998 | Hung et al. | |
| 5,811,834 A | 9/1998 | Tamano et al. | |
| 5,837,391 A | 11/1998 | Utsugi | |
| 5,851,709 A | 12/1998 | Grande et al. | |
| 5,908,581 A | 6/1999 | Chen et al. | |
| 5,927,247 A | 7/1999 | Tanaka | |
| 5,928,802 A | 7/1999 | Shi et al. | |
| 5,935,720 A | 8/1999 | Chen et al. | |
| 5,935,721 A | 8/1999 | Shi et al. | |
| 5,969,474 A | 10/1999 | Arai | |
| 5,981,306 A | 11/1999 | Burrows et al. | |
| 6,020,078 A | 2/2000 | Chen et al. | |
| 6,066,357 A | 5/2000 | Tang et al. | |
| 6,137,223 A | 10/2000 | Hung et al. | |
| 6,140,763 A | 10/2000 | Hung et al. | |
| 6,172,459 B1 | 1/2001 | Hung et al. | |
| 6,208,077 B1 | 3/2001 | Hung | |
| 6,226,890 B1 | 5/2001 | Boroson et al. | |
| 6,237,529 B1 | 5/2001 | Spahn et al. | |
| 6,251,531 B1 | 6/2001 | Enokida et al. | |
| 6,278,236 B1 | 8/2001 | Madathil et al. | |
| 6,284,393 B1 | 9/2001 | Hosokawa et al. | |
| 6,337,492 B1 | 1/2002 | Jones et al. | |
| 6,423,429 B2 | 7/2002 | Kido et al. | |
| 6,468,675 B1 | 10/2002 | Ishikawa et al. | |
| 6,534,199 B1 | 3/2003 | Hosokawa et al. | |
| 6,664,396 B1 | 12/2003 | Cosimbescu | |
| 6,670,051 B2 | 12/2003 | Oda et al. | |
| 6,689,493 B2 | 2/2004 | Motomatsu et al. | |
| 6,720,092 B2 | 4/2004 | Hatwar | |
| 6,720,573 B2 | 4/2004 | Son et al. | |
| 6,743,948 B1 | 6/2004 | Hosokawa et al. | |
| 6,773,832 B2 | 8/2004 | Sotoyama et al. | |
| 6,821,644 B2 | 11/2004 | Ishikawa et al. | |
| 6,824,895 B1 | 11/2004 | Sowinski et al. | |
| 6,929,871 B2 | 8/2005 | Arakane et al. | |
| 6,936,961 B2 | 8/2005 | Liao et al. | |
| 6,936,962 B2 * | 8/2005 | Hamada et al. | 313/506 |
| 6,951,693 B2 | 10/2005 | Hosokawa et al. | |
| 7,165,340 B2 | 1/2007 | Long et al. | |
| 7,232,588 B2 | 6/2007 | Long et al. | |
| 7,238,389 B2 | 7/2007 | Long et al. | |
| 7,288,285 B2 | 10/2007 | Long et al. | |
| 7,288,286 B2 | 10/2007 | Long et al. | |
| 2003/0068528 A1 | 4/2003 | Thompson et al. | |
| 2004/0113547 A1 | 6/2004 | Son et al. | |
| 2004/0150327 A1* | 8/2004 | Kawai et al. | 313/504 |
| 2004/0209118 A1 | 10/2004 | Seo et al. | |
| 2004/0255857 A1 | 12/2004 | Chow et al. | |
| 2005/0058853 A1 | 3/2005 | Cosimbescu et al. | |
| 2006/0029828 A1* | 2/2006 | Kanno et al. | 428/690 |
| 2006/0033421 A1 | 2/2006 | Matsuura et al. | |
| 2006/0068221 A1 | 3/2006 | Saitoh et al. | |
| 2006/0093856 A1 | 5/2006 | Helber et al. | |
| 2006/0127698 A1 | 6/2006 | Tokailin et al. | |
| 2006/0134460 A1 | 6/2006 | Kondakova et al. | |
| 2006/0177576 A1 | 8/2006 | Long et al. | |
| 2006/0202190 A1 | 9/2006 | Funahashi | |
| 2006/0238119 A1* | 10/2006 | Spindler | 313/506 |
| 2008/0102311 A1 | 5/2008 | Funahashi | |
| 2008/0138655 A1 | 6/2008 | Lecloux et al. | |
| 2008/0284318 A1* | 11/2008 | Deaton et al. | 313/504 |

FOREIGN PATENT DOCUMENTS

| | | |
|---|---|---|
| EP | 0 732 868 | 9/1996 |
| EP | 0 891 121 | 1/1999 |
| EP | 1 069 628 A2 | 7/2000 |
| EP | 1 029 909 | 8/2000 |
| EP | 1 076 368 | 2/2001 |
| EP | 1 722 604 A1 | 2/2005 |
| JP | 8-333569 | 12/1996 |
| JP | 09-013026 | 1/1997 |
| JP | 2006-253445 | 9/2006 |
| JP | 2007-254386 | 4/2007 |
| WO | WO 98/55561 | 12/1998 |
| WO | WO 00/18851 | 4/2000 |
| WO | WO 00/57676 | 9/2000 |
| WO | WO 00/70655 | 11/2000 |
| WO | WO 01/41512 | 6/2001 |
| WO | WO 01/93642 | 12/2001 |
| WO | 2007/086701 A1 | 8/2007 |

OTHER PUBLICATIONS

Double Injection Electroluminescence in Anthracene by J. Dresner, RCA Laboratories, Princeton, NJ, pp. 322-334, RCA Review, Jun. 1969.

Ho et al, Appl. Phys. Lett., 91(8), 083515/1 (2007).

Nonoyama, "Benzo[$h$]quinolin-10-yl-N Iridium (III) Complexes", Bulletin of the Chemical Society of Japan, vol. 47(3), pp. 767-768, 1974.

Johnson et al., "Luminescent Iridium(I), Rhodium(I), and Platinum(II) Dithiolate Complexes", Journal of American Chemical Society, vol. 105, pp. 1795-1802, 1983.

Wrighton et al., The Nature of the Lowest Excited State in Tricarbonylchloro-1,10-phenanthrolinerhenium(I) and Related Complexes, Journal of the American Chemical Society, vol. 96, No. 4, pp. 998-1003, 1974.

Yam, "Luminescent carbon-rich rhenium(I) complexes", Chem. Commun. pp. 789-796, 2001.

Ma et al., "Electroluminescence from triplet metal-ligand charge-transfer excited state of transition metal complexes", Synthetic Metals 94, pp. 245-248, 1998.

Kido et al., "Electroluminescence in a Terbium Complex", Chem. Lett. pp. 657-660, 1990.

Kido et al., "Organic electroluminescent devices using lanthanide complexes", J. Alloys and Compounds 192, pp. 30-33, 1993.

Kido et al., "White-Light-Emitting Organic Electroluminescent Device Using Lanthanide Complexes, Jpn. J. Appl. Phys., vol. 35, pp. L394-L396, 1996.

Kido et al., "Bright red light-emitting organic electroluminescent devices having a europium complex as an emitter", Appl. Phys. Lett., 65 (17), pp. 2124-2126, 1994.

Chen et al., "Recent Developments in Molecular Organic Electroluminescent Materials", Macromol. Symp. 125, pp. 1-48, 1997.

Hung et al., "Recent progress of molecular organic electroluminescent materials and devices", Materials Science and Engineering R39, pp. 143-222, 2002.

* cited by examiner

OLED DEVICE WITH STABILIZED GREEN LIGHT-EMITTING LAYER

FIELD OF THE INVENTION

This invention relates to an electroluminescent (EL) device, more specifically, an organic light-emitting diode (OLED) device having a green light-emitting layer containing an anthracene host, a bis-diarylamino substituted anthracene as a dopant and a quinacridone or biphenylstyrylamine stabilizer.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al, U.S. Pat. No. 3,172,862, issued Mar. 9, 1965; Gurnee, U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often greater than 100V.

More recent organic EL devices include an organic EL element consisting of extremely thin layers (e.g. <1.0 μm) between the anode and the cathode. Herein, the term "organic EL element" encompasses the layers between the anode and cathode. Reducing the thickness lowered the resistance of the organic layers and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by C. Tang et al. (*J. Appl. Phys.* 65, 3610 (1989)). The light-emitting layer commonly consists of a host material doped with a guest material, otherwise known as a dopant. Still further, there has been proposed in U.S. Pat. No. 4,769,292 a four-layer EL element comprising a hole-injecting layer (HIL), a hole-transporting layer (HTL), a light-emitting layer (LEL) and an electron-transporting/injecting layer (ETL). These structures have resulted in improved device efficiency.

EL devices in recent years have expanded to include not only single color emitting devices, such as red, green and blue, but also white-devices, devices that emit white light. Efficient white light producing OLED devices are highly desirable in the industry and are considered as a low cost alternative for several applications such as paper-thin light sources, backlights in LCD displays, automotive dome lights, and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

Since the early inventions, further improvements in device materials have resulted in improved performance in attributes such as color, stability, luminance efficiency and manufacturability, e.g., as disclosed in U.S. Pat. Nos. 5,061,569; 5,409,783; 5,554,450; 5,593,788; 5,683,823; 5,908,581; 5,928,802; 6,020,078; and 6,208,077, amongst others.

Notwithstanding all of these developments, there are continuing needs for organic EL device components, such as green light emitting layers, which will provide even lower device drive voltages and hence lower power consumption, while maintaining high luminance efficiencies and long lifetimes combined with high color purity.

U.S. 2005/0058853 discloses OLED devices with green light-emitting layers with a host, a green dopant and a stabilizing dopant where the green dopant has a lower bandgap energy than the stabilizing dopant. Anthracene hosts as well as quinacridone green dopants are described.

U.S. 2008/0102311 discloses OLED devices with light-emitting layers containing bis-9,10-(diarylamino)anthracenes as a green light-emitting compound with anthracene hosts. The light-emitting layer can contain anthracenes, styryls, and quinacridones.

U.S. 2006/0202190; U.S. Pat. Nos. 5,759,444, 6,251,531 and 5,811,834 discloses OLED devices with light-emitting layers containing bis-9,10-(diarylamino)anthracenes as a light-emitting compound. The light-emitting layer can contain anthracenes, styryls, and quinacridones. U.S. Pat. No. 6,743,948 discloses OLED devices with light-emitting layers containing bis-9,10-(diarylamino)anthracenes and bis-9,10-(diarylaminophenyl)anthracenes as light-emitting materials. Anthracene, quinacridone, and stilbene derivatives can also be present U.S. Pat. No. 6,951,693 discloses OLED devices with light-emitting layers containing bis-9,10-(diarylamino)anthracenes and bis-9,10-(diarylaminophenyl)anthracenes where the aryl substituents of the amine are substituted with styryl groups as light-emitting materials. Anthracene, quinacridone, and stilbene derivatives can also be present.

U.S. Pat. No. 6,929,871 discloses OLED devices with light-emitting layers containing bis-9,10-(diarylamino)anthracenes and bis-9,10-(diarylaminophenyl)anthracenes as light-emitting materials. Other dopants including styrylbenzenes and amine containing dopants can be present.

U.S. 2008/0138655; U.S. 2006/127698; U.S. 2004/0209118; JP2006-253445; EP1722604; and U.S. 2006/033421 discloses OLED devices with light-emitting layers containing bis-9,10-(diarylamino)anthracenes as a green light-emitting compound with anthracene hosts. EP1069628 discloses OLED devices with light-emitting layers containing bis-9,10-(diarylamino)anthracenes as a green light-emitting compound with electron-transporting hosts.

U.S. Pat. Nos. 6,821,644; 6,670,051 and 6,468,675 disclose OLED devices with light-emitting layers containing bis-9,10-(diarylamino)anthracenes and bis-9,10-(diarylaminophenyl)anthracenes where the aryl substituents of the amine are substituted with styryl groups as light-emitting materials.

U.S. 2006/068221 discloses OLED devices with light-emitting layers containing bis-9,10-(diarylamino)anthracenes as a light-emitting compound and polyaromatic compounds which are not 9,10-disubstituted anthracenes as host. Quinacridones and bis-styryls can be present. U.S. Pat. No. 6,534,199 discloses OLED devices with light-emitting layers containing styrylamines as green light-emitting compounds with anthracene hosts.

Quinacridones are described in U.S. Pat. No. 5,593,788; JP 09-13026A and U.S. Pat. No. 6,664,396. Biphenylstyrylamines are described in U.S. 2006/0093856; WO2007086701; JP2007-254386; and Ho et al, Appl. Phys. Lett., 91(8), 083515/1 (2007).

However, these devices do not necessarily have all desired EL characteristics in terms of high luminance, low drive voltages, and sufficient operational stability. Notwithstanding all these developments, there remains a need to improve efficiency and reduce drive voltage of OLED devices, as well as to provide embodiments with other improved features.

SUMMARY OF THE INVENTION

The invention provides an OLED device comprising an anode, a cathode and a green light-emitting layer located therebetween, said light-emitting layer comprising:
 a) an anthracene host;
 b) a bis-diarylamine 9,10-substituted anthracene according to Formula (1):

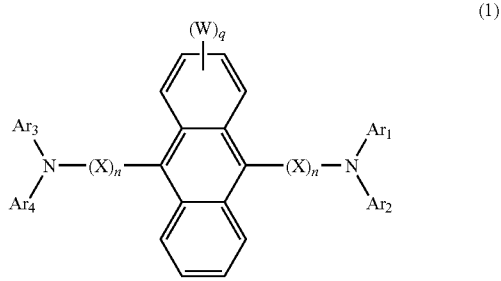

(1)

wherein:
 X is an aryl group of 6 to 30 nucleus carbon atoms;
 n is 0 or 1;
 $Ar_1$, $Ar_2$, $Ar_3$ and $Ar_4$ each independently represent a substituted or unsubstituted aryl group of 6 to 30 nucleus carbon atoms where $Ar_1$ and $Ar_2$ or $Ar_3$ and $Ar_4$ can optionally be joined together;
 W is an alkyl, aryl or heterocyclic group; and
 q is an integer of 0 to 2; and
 c) a stabilizer compound which is selected from a quinacridone or a biphenylstyrylamine.

Devices of the invention provide improvement in features such as increased stability, increased efficiency or lower drive voltage or combinations thereof, while maintaining excellent color.

DETAILED DESCRIPTION OF THE INVENTION

Figure 1:
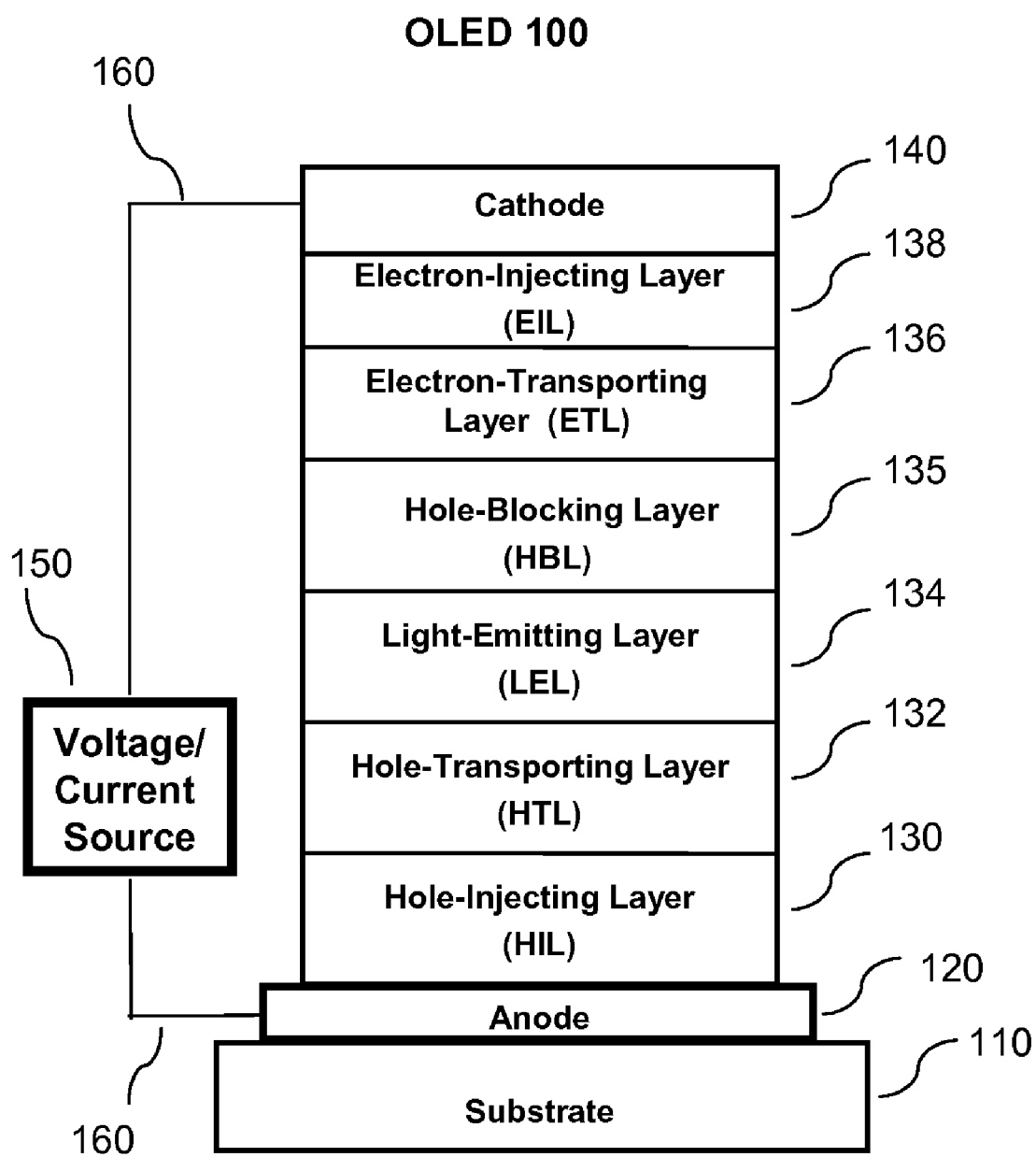
FIG. 1 shows a schematic cross-sectional view of one embodiment of an inventive OLED device. It will be understood that FIG. 1 is not to scale since the individual layers are too thin and the thickness differences of various layers are too great to permit depiction to scale.

The invention is generally as described above. An OLED device of the invention is a multilayer electroluminescent device comprising a cathode, an anode, light-emitting layer(s) (LEL), electron-transporting layer(s) (ETL) and electron-injecting layer(s) (EIL) and optionally additional layers such as hole-injecting layer(s), hole-transporting layer(s), exciton-blocking layer(s), spacer layer(s), connecting layer(s) and hole-blocking layer(s).

The host of the light-emitting layer of the invention is an anthracene. A host material is commonly understood to be non-emitting; that is, produces no significant (less than 10% of the total) amount of light produced by that layer. For a green layer, the amount of emitted light from the anthracene can be easily determined by examination of the spectrum of the emitted light.

The anthracene host of the invention is according to Formula (4).

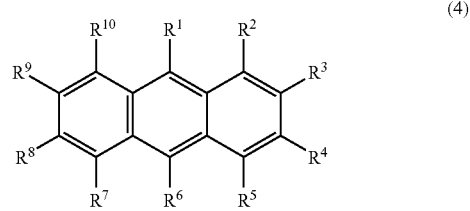

(4)

In Formula (4), $R^1$ and $R^6$ each independently represent an aryl group having 6-24 carbon atoms such as a phenyl group or a naphthyl group. $R^2$-$R^5$ and $R^7$-$R^{10}$ are each independently chosen from hydrogen, alkyl groups from 1-24 carbon atoms or aromatic groups (including heterocyclic aromatic groups) from 5-24 carbon atoms.

In one suitable embodiment $R^1$ and $R^6$ each represent an independently selected phenyl group, biphenyl group, or naphthyl group. $R^3$ represents hydrogen or an aromatic group from 6-24 carbon atoms. $R^2$, $R^4$, $R^5$, $R^7$-$R^{10}$ represent hydrogen.

Illustrative examples of useful anthracenes are listed below.

P-1
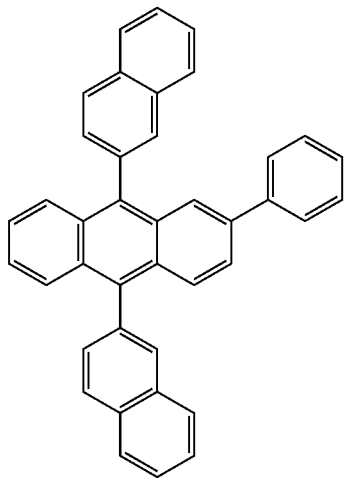

P-2
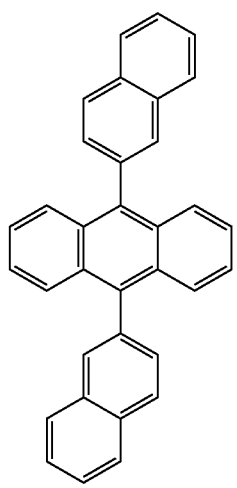

P-3

P-4
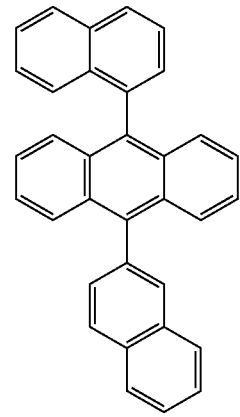

P-5
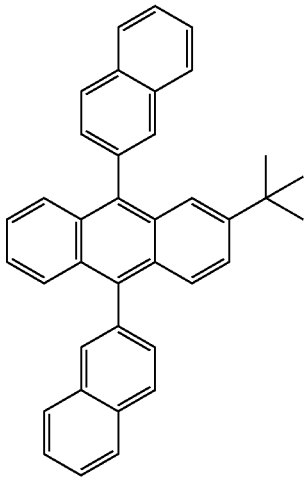

The light-emitting layer of the invention contains a bis-diarylamine 9,10-substituted anthracene as a green light-emitting compound. Desirably, the bis-diarylamine 9,10-substituted anthracene should be the predominating light-emitting material in that layer. By predominating, it is meant that at least 90% of the total amount of light is produced by the compound; preferably, it should be the only detectable light-emitter in this layer. In most cases, the amount of emitted light from the bis-diarylamine 9,10-substituted anthracene can be easily determined by examination of the spectrum of the emitted light so long as there are no other emitting species that produce the same spectra of light.

The bis-diarylamine 9,10-substituted anthracene is according to Formula (1):

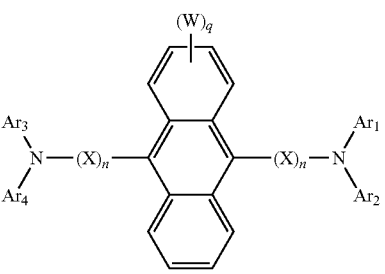

(1)

wherein:
X is an aryl group of 6 to 30 nucleus carbon atoms;
n is 0 or 1;
$Ar_1$, $Ar_2$, $Ar_3$ and $Ar_4$ each independently represent a substituted or unsubstituted aryl group of 6 to 30 nucleus carbon atoms where $Ar_1$ and $Ar_2$ or $Ar_3$ and $Ar_4$ can optionally be joined together;
W is an alkyl, aryl or heterocyclic group; and
q is an integer of 0 to 2.

When n is 0, the compound is a bis-9,10-diarylaminoanthracene according to Formula (1b):

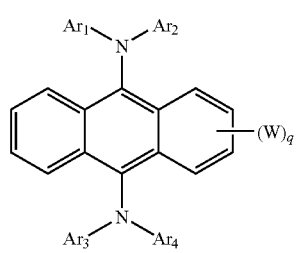

(1b)

wherein $Ar_1$, $Ar_2$, $Ar_3$, $Ar_4$, W and q are the same as in Formula (1). Preferably, $Ar_1$, $Ar_2$, $Ar_3$ and $Ar_4$ each independently represent a substituted or unsubstituted aryl group of 6 to 10 nucleus carbon atoms. Most preferred are compounds where q is 0 and $Ar_1$, $Ar_2$, $Ar_3$ and $Ar_4$ are all individually substituted or unsubstituted phenyl or naphthyl. A desirable example of a substituted phenyl is p-methylphenyl(tolyl). Preferred W groups are alkyl such as t-butyl or aryl groups such as substituted or unsubstituted phenyl or substituted or unsubstituted naphthyl.

Some illustrative examples of compounds according to Formula (1b) are:

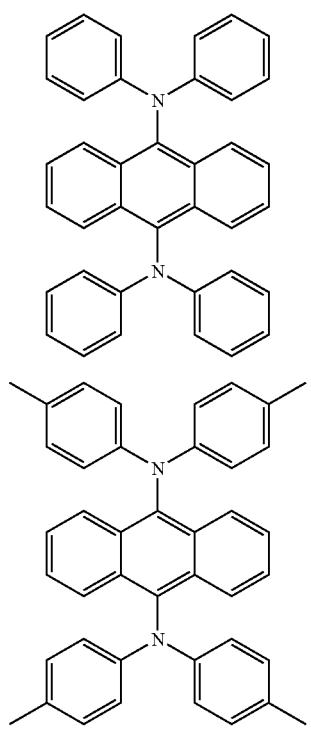

GEb-1

GEb-2

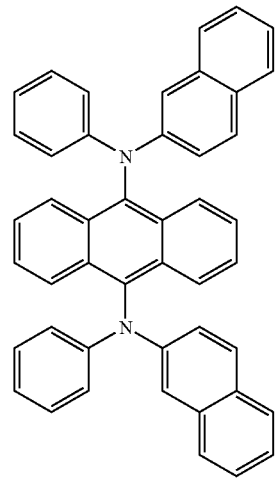

GEb-3

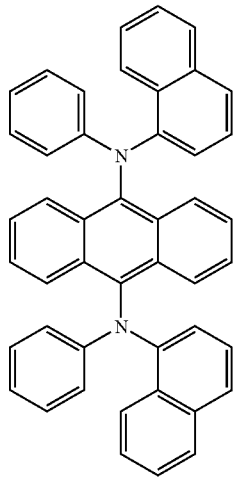

GEb-4

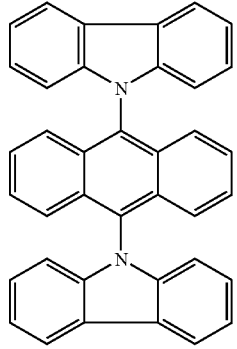

GEb-5

-continued

GEb-6

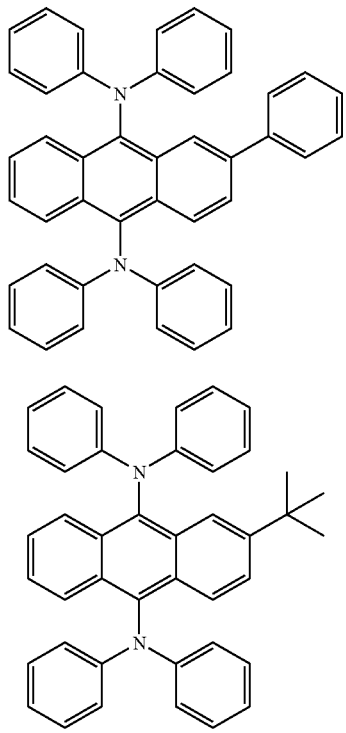

GEb-7

GEb-8

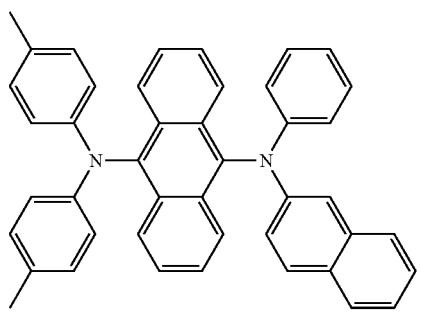

When n is 1, the compound is a bis-9,10-(diarylaminophenyl)anthracene according to Formula (1c):

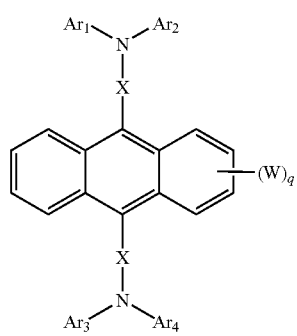

(1c)

wherein X, $Ar_1$, $Ar_2$, $Ar_3$, $Ar_4$, W and q are the same as in Formula (1). Preferably, X is a phenyl group where the diarylamino group is located para to the attachment to the anthracene as in Formula (1d):

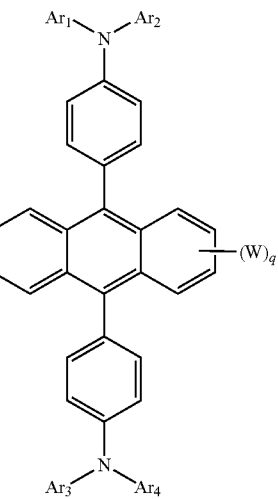

(1d)

wherein $Ar_1$, $Ar_2$, $Ar_3$ and $Ar_4$ each independently represent a substituted or unsubstituted aryl group of 6 to 10 nucleus carbon atoms where $Ar_1$ and $Ar_2$ or $Ar_3$ and $Ar_4$ can optionally be joined together and W and q are the same as in Formula (1). Most preferred are compounds as shown in Formula (1e):

(1e)

wherein:
$Ar_5$, $Ar_6$, $Ar_7$, $Ar_8$ are all individually substituted or unsubstituted phenyl or naphthyl; and
Z is hydrogen, alkyl, aryl, naphthyl or heterocyclic.

In Formula (1e), one desirable example of a substituted phenyl for $Ar_5$, $Ar_6$, $Ar_7$ or $Ar_8$ is p-methylphenyl(tolyl). For Z, the most desirable is hydrogen, alkyl (particularly methyl or t-butyl), phenyl, or naphthyl.

Some illustrative examples of compounds according to Formula (1c) are:

GEc-1
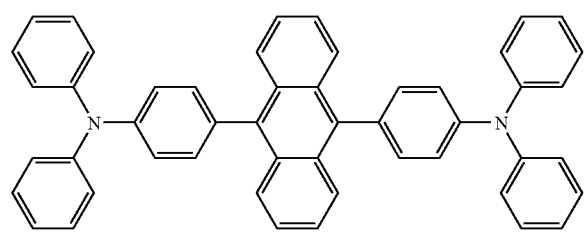

GEc-2
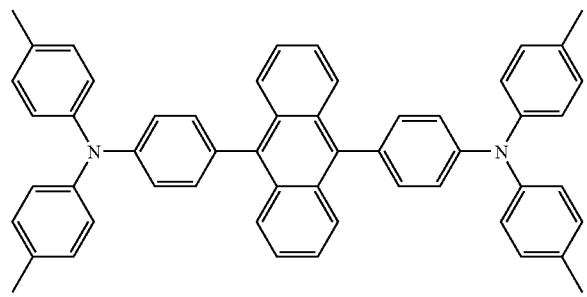

GEc-3
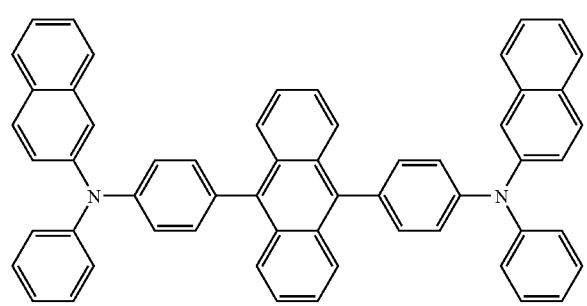

GEc-4
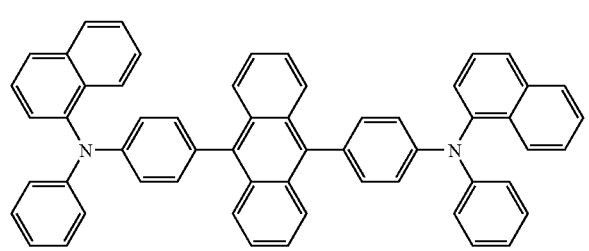

GEc-5
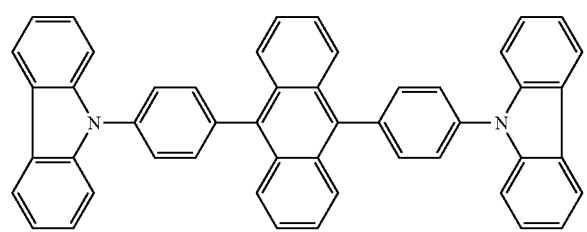

GEc-6
GEc-7
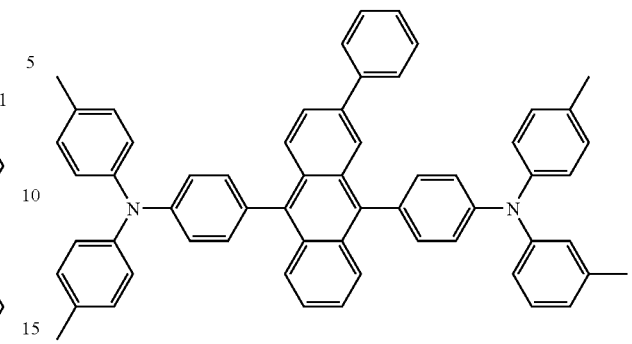

GEc-8
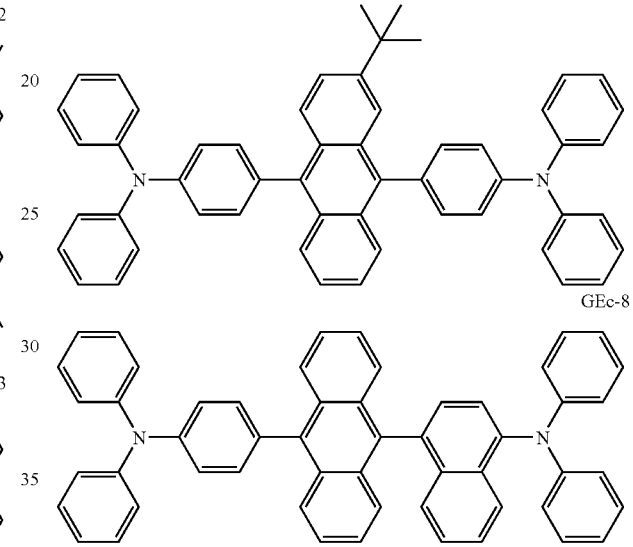

The green light-emitting layer of the invention also contains a third compound which has a stabilizing effect on the particular combination of an anthracene host and a bis-diarylamine 9,10-substituted anthracene dopant. This third compound is either a quinacridone or a biphenylstyrylamine. Desirably, the stabilizer should be non-emitting; that is, produces no significant (less than 10% of the total) amount of light produced by that layer. For a green layer, the amount of emitted light from the biphenylstyrylamine can be readily determined by examination of the spectrum of the emitted light. However, quinacridones are known emitters of green light. In some cases, depending on the structures of both the quinacridone and the bis-diarylamine 9,10-substituted anthracene, there can be substantial overlap between the spectra of the emitted light when determined separately and it can be difficult to determine the amount of relative emission by examination of the spectrum of emitted light. To avoid this, the stabilizer should be chosen such that its energy of excited state is sufficiently higher than that of the bis-diarylamine 9,10-substituted anthracene. As a result, the stabilizer will not emit and there will not be significant changes of spectrum of the emitting dopant. Significant change in spectral data can be defined using shift of the emission maximum ($\lambda_{max}$). Shifts of about 10 nm in $\lambda_{max}$ can be considered as negligible spectral change.

The quinacridone is desirably according to Formula (2):

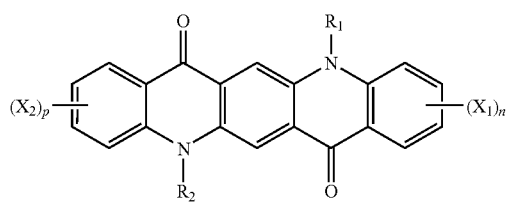

(2)

wherein:
$R_1$ and $R_2$ are each independently alkyl or aryl;
$X_1$ and $X_2$ are each independently chloro or fluoro; and
n and p are each independently 0 to 4.
More preferred are when $X_1$ and $X_2$ are fluoro and n and p are both either 0 or 1.
Preferred substituents for $R_1$ and $R_2$ are methyl or phenyl.
Some illustrative examples of suitable quinacridones are FD-6 as well as:

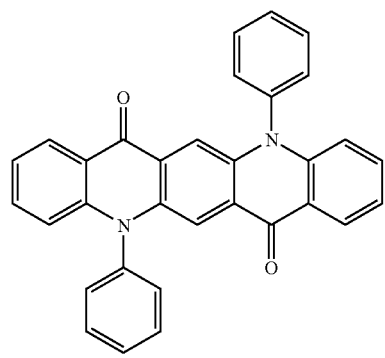

QA-1(FD-8)

(DPQA)

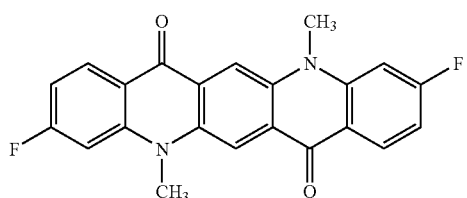

QA-2(FD-7)

(CFDMQA)

The biphenylstyrylamine is desirably a biphenylstyrylamine according to Formula (3):

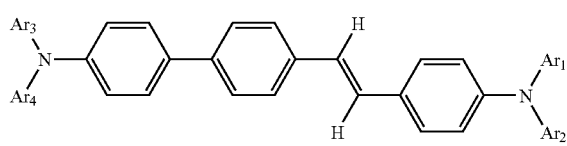

(3)

wherein:
$Ar_1$-$Ar_4$ are each independently an aryl group of 6 to 24 carbon atoms where $Ar_1$-$Ar_2$ and $Ar_3$-$Ar_4$ can be optionally joined together to form a ring system.

Some examples of suitable $Ar_1$-$Ar_4$ groups are phenyl, naphthyl, anthracenyl, fluoranthenyl, pyrenyl, and phenanthryl. $Ar_1$ and $Ar_2$ or $Ar_3$ and $Ar_4$ can be joined to form a carbazole group. Preferably, $Ar_1$-$Ar_4$ groups are each individually unsubstituted phenyl or alkyl substituted phenyl. Methyl groups are particularly preferred alkyl substituents for when $Ar_1$-$Ar_4$ are alkyl substituted phenyl.

Some illustrative examples of suitable biphenylstyrylamines are:

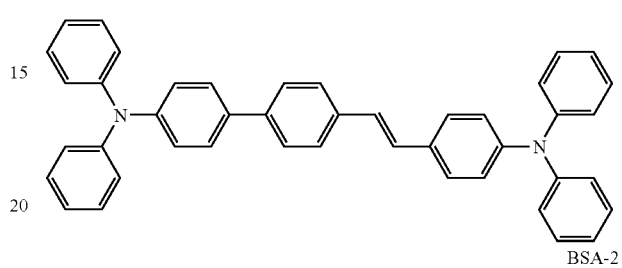

BSA-1

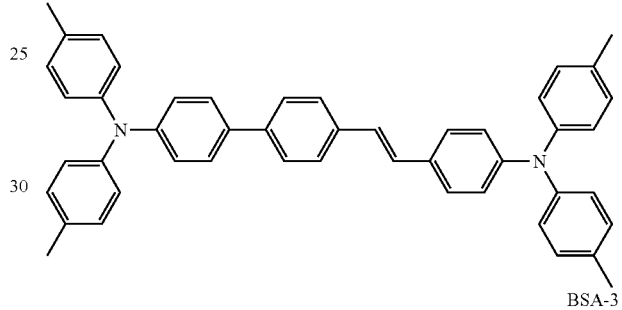

BSA-2

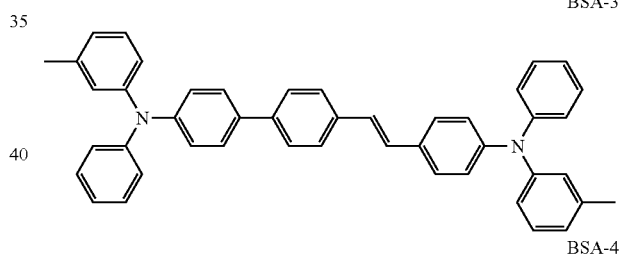

BSA-3

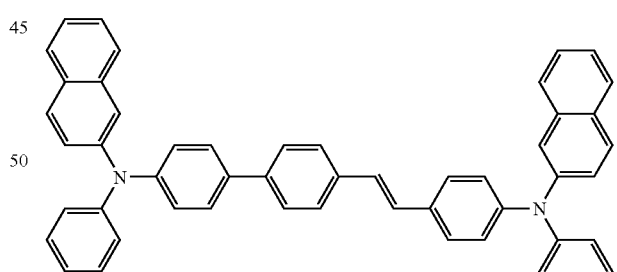

BSA-4

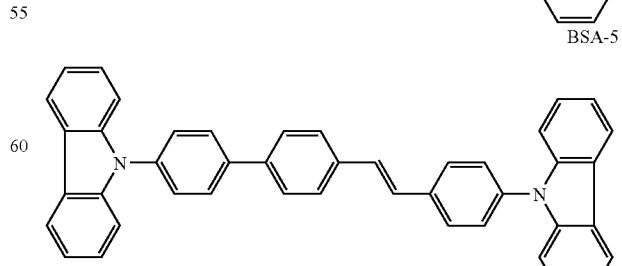

BSA-5

The green LEL of the invention can contain additional co-hosts besides the anthracene. The additional co-host should not significantly emit light and can be, for example, another anthracene, or a tertiary amine compound such as those known to be useful in hole-transporting layers. If present as a single host, the amount of the anthracene host can range from 40% to 99% by volume, desirably in the range of 80 to 98% by volume. If the anthracene is present as a mixture of hosts, the total amount of all hosts should also be 40% to 99% by volume, desirably in the range of 80 to 98% volume. The amount of anthracene in the mixture of hosts is not limited but suitably is 50% or greater by volume of the total amount of host. The green LEL of the invention contains a bis-diarylamine 9,10-substituted anthracene as the predominating green light emitting compound. Appropriate ranges of the bis-diarylamine 9,10-substituted anthracene are 0.1%-40% by volume, with a preferred range of 0.5-25% by volume and a most desirable range of 3% to 15% by volume. The green LEL of the inventions contains a stabilizer compound which is either a quinacridone or a biphenylstyrylamine. High levels of stabilizers are not required to provide an improvement. A suitable range for the stabilizer is from 0.1%-10% by volume with a most preferred range of 0.5-6% by volume. Based on these ranges, preferred concentration (by volume) for all components in an inventive green LEL would be the bis-diarylamine 9,10-substituted anthracene in the range of 0.5-25% by volume and the stabilizer in the range of 0.5%-6% by volume with the remainder being host(s). Even more preferred would be where the bis-diarylamine 9,10-substituted anthracene is in the range of 3-15% by volume and the stabilizer is in the range of 0.5%-6% by volume with the remainder being host(s)

It is important that the green LEL of the invention not only have improved stability but also provide good green color. As previously noted, it is desired that the bis-diarylamine 9,10-substituted anthracene be the only light-emitting material in the layer and that the anthracene host and stabilizer compound have no or at least no detectable light emission so that color of emission can be controlled and high efficiency is maintained. Light emission from the stabilizer compound would be detrimental to color purity as well as reduce overall efficiency. A desirable color emission has a $CIE_x$ coordinate value in the range of 0.360-0.390 and a $CIE_y$ coordinate of 0.600-0.610. In this regard, bis-diarylamine 9,10-substituted anthracenes according to Formula (1b) are more desirable than those according to Formulas (1c)-(1e), which have CIEx coordinates smaller (desirably in the range of 0.250-0.300) than those compounds of Formula (1b). Although not as desirable as the color derived from compounds of Formula (1b), the color produced by compounds of Formulas (1c)-(1e) can be still useful.

Examples of preferred combinations of the invention are those wherein the anthracene host compound is selected from P-1 and P-4, the bis-diarylamine 9,10-substituted anthracene dopant is selected from GEb-1, GEb-2, GEb-6, GEc-2, and GEc-6 and the stabilizer compound selected from QA-1 and BSA-2. Any of these possible combinations are desirable. The most desirable combinations are where the anthracene host compound is P-1, the bis-diarylamine 9,10-substituted anthracene dopant is selected from GEb-1 and GEb-2 and the stabilizer compound selected from QA-1 and BSA-2 in any combination.

In one suitable embodiment the EL device emits white light, which can include complimentary emitters, a white emitter, or using filters. This invention can be used in so-called stacked device architecture, for example, as taught in U.S. Pat. Nos. 5,703,436 and 6,337,492. Embodiments of the current invention can be used in stacked devices that comprise solely fluorescent elements to produce white light. The green LEL of the invention is a fluorescent layer. The device can also include combinations of fluorescent emitting materials and phosphorescent emitting materials (sometimes referred to as hybrid OLED devices). To produce a white emitting device, ideally the hybrid fluorescent and phosphorescent device would comprise a blue fluorescent emitter and proper proportions of a green and red phosphorescent emitter, or other color combinations suitable to make white emission. However, hybrid devices having non-white emission can also be useful by themselves. Hybrid fluorescent and phosphorescent elements having non-white emission can also be combined with additional phosphorescent elements in series in a stacked OLED. For example, white emission can be produced by one or more hybrid blue fluorescent/red phosphorescent elements stacked in series with a green phosphorescent element using p/n junction connectors as disclosed in Tang et al. U.S. Pat. No. 6,936,961B2.

In one desirable embodiment, the EL device is part of a display device. In another suitable embodiment the EL device is part of an area lighting device. The EL device of the invention is useful in any device where stable light emission is desired such as a lamp or a component in a static or motion imaging device, such as a television, cell phone, DVD player, or computer monitor.

As used herein and throughout this application, the term carbocyclic and heterocyclic rings or groups are generally as defined by the *Grant & Hackh's Chemical Dictionary*, Fifth Edition, McGraw-Hill Book Company. A carbocyclic ring is any aromatic or non-aromatic ring system containing only carbon atoms and a heterocyclic ring is any aromatic or non-aromatic ring system containing both carbon and non-carbon atoms such as nitrogen (N), oxygen (O), sulfur (S), phosphorous (P), silicon (Si), gallium (Ga), boron (B), beryllium (Be), indium (In), aluminum (Al), and other elements found in the periodic table useful in forming ring systems. For the purpose of this invention, also included in the definition of a heterocyclic ring are those rings that include coordinate bonds. The definition of a coordinate or dative bond can be found in *Grant & Hackh's Chemical Dictionary*, pages 91 and 153. In essence, a coordinate bond is formed when electron rich atoms such as O or N, donate a pair of electrons to electron deficient atoms or ions such as aluminum, boron or alkali metal ions such as $Li^+$, $Na^+$, $K^+$ and $Cs^+$. One such example is found in tris(8-quinolinolato)aluminum(III), also referred to as Alq, wherein the nitrogen on the quinoline moiety donates its lone pair of electrons to the aluminum atom thus forming the heterocycle and hence providing Alq with a total of 3 fused rings. The definition of a ligand, including a multidentate ligand, can be found in *Grant & Hackh's Chemical Dictionary*, pages 337 and 176, respectively.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group can be halogen or can be bonded to the remainder of the molecule by an atom of carbon, silicon, oxygen, nitrogen, phosphorous, sulfur, selenium, or boron. The substituent can be, for example, halogen, such as chloro, bromo or fluoro; nitro; hydroxyl; cyano; carboxyl; or groups which can be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1(N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which can be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents can themselves be further substituted one or more times with the described substituent groups. The particular substituents used can be selected by those skilled in the art to attain desirable properties for a specific application and can include, for example, electron-withdrawing groups, electron-donating groups, and steric groups. When a molecule can have two or more substituents, the substituents can be joined together to form a ring such as a fused ring unless otherwise provided. Generally, the above groups and substituents thereof can include those having up to 48 carbon atoms, typically 1 to 36 carbon atoms and usually less than 24 carbon atoms, but greater numbers are possible depending on the particular substituents selected.

The following is the description of the layer structure, material selection, and fabrication process for OLED devices.

General OLED Device Architecture

The present invention can be employed in many OLED configurations using small molecule materials, oligomeric materials, polymeric materials, or combinations thereof These include from very simple structures having a single anode and cathode to more complex devices, such as passive matrix displays having orthogonal arrays of anodes and cathodes to form pixels, and active-matrix displays where each pixel is controlled independently, for example, with thin film transistors (TFTs). There are numerous configurations of the organic layers wherein the present invention is successfully practiced. For this invention, essential requirements are a cathode, an anode and a LEL.

One embodiment according to the present invention and especially useful for a small molecule device is shown in FIG. 1. OLED 100 contains a substrate 110, an anode 120, a hole-injecting layer 130, a hole-transporting layer 132, a light-emitting layer 134, a hole-blocking layer 135, an electron-transporting layer 136, an electron-injecting layer (EIL) 138 and a cathode 140. The LEL 134 contains the inventive combination of anthracene host, bis-diarylamine 9,10-substituted anthracene dopant and stabilizer compound. In some other embodiments, there are optional spacer layers on either side of the LEL. These spacer layers do not typically contain light emissive materials. All of these layer types will be described in detail below. Note that the substrate can alternatively be located adjacent to the cathode, or the substrate can actually constitute the anode or cathode. Also, the total combined thickness of the organic layers is preferably less than 500 nm.

In another embodiment, there is no hole-blocking layer (HBL) 135 located between the ETL and the LEL. In yet other embodiments, the electron-injecting layer can be subdivided into two or more sublayers. In one illustrative example, the OLED device has no hole-blocking layer and only one hole-injecting, electron-injecting and electron-transporting layer. In another illustrative example, the EIL 138 is further divided into two sublayers (not shown), a first electron-injecting layer (EIL1) adjacent to the ETL 136 and a second electron-injecting layer (EIL2) located between the EIL1 and the cathode.

The anode and cathode of the OLED are connected to a voltage/current source 150, through electrical conductors 160. Applying a potential between the anode and cathode such that the anode is at a more positive potential than the cathode operates the OLED. Holes are injected into the organic EL element from the anode. Enhanced device stability can sometimes be achieved when the OLED is operated in an AC mode where, for some time period in cycle, the potential bias is reversed and no current flows. An example of an AC driven OLED is described in U.S. Pat. No. 5,552,678.

Anode

When the desired EL emission is viewed through the anode, anode 120 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 120. For applications where EL emission is viewed only through the cathode 140, the transmissive characteristics of the anode 120 are immaterial and any conductive material, transparent, opaque or reflective can be used. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable way such as evaporation, sputtering, chemical vapor deposition, or electrochemical process. Anodes can be patterned using well-known photolithographic processes. Optionally, anodes can be polished prior to application of other layers to reduce surface roughness so as to reduce short circuits or enhance reflectivity.

Hole Injection Layer

Although it is not always necessary, it is often useful to provide an HIL in the OLEDs. HIL 130 in the OLEDs can serve to facilitate hole injection from the anode into the HTL 132, thereby reducing the drive voltage of the OLEDs. Suitable materials for use in HIL 130 include, but are not limited to, porphyrinic compounds as described in U.S. Pat. No. 4,720,432 and some aromatic amines, for example, 4,4',4"-tris[(3-ethylphenyl)phenylamino]triphenylamine (m-TDATA). Alternative hole-injecting materials reportedly useful in OLEDs are described in EP 0 891 121 A1 and EP 1 029 909 A1. Aromatic tertiary amines discussed below can also be useful as hole-injecting materials. Other useful hole-injecting materials such as dipyrazino[2,3-f:2',3'-h]quinoxalinehexacarbonitrile (HAT-CN) are described in U.S. Publication 2004/0113547 A1 and U.S. Pat. No. 6,720,573. In addition, a p-type doped organic layer is also useful for the HIL as described in U.S. Pat. No. 6,423,429. The term "p-type doped organic layer" means that this layer has semiconducting properties after doping, and the electrical current through this layer is substantially carried by the holes. The conductivity is provided by the formation of a charge-transfer complex as a result of hole transfer from the dopant to the host material.

The thickness of the HIL 130 is in the range of from 0.1 nm to 200 nm, preferably, in the range of from 0.5 nm to 150 nm.

Hole Transport Layer

The HTL 132 contains at least one hole-transporting material such as an aromatic tertiary amine, where the latter is understood to be a compound containing at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals or at least one active hydrogen-containing group is disclosed by Brantley, et al. in U.S. Pat. Nos. 3,567,450 and 3,658,520.

A more preferred class of aromatic tertiary amines is those which include at least two aromatic tertiary amine moieties as described in U.S. Pat. Nos. 4,720,432 and 5,061,569. Such compounds include those represented by structural Formula (A)

(A)

wherein:
  $Q_1$ and $Q_2$ are independently selected aromatic tertiary amine moieties; and
  G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula (B)

(B)

wherein:
  $R_1$ and $R_2$ each independently represents a hydrogen atom, an aryl group, or an alkyl group or $R_1$ and $R_2$ together represent the atoms completing a cycloalkyl group; and
  $R_3$ and $R_4$ each independently represents an aryl group, which is in turn substituted with a diaryl substituted amino group, as indicated by structural Formula (C)

(C)

wherein:
  $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by Formula (C), linked through an arylene group. Useful tetraaryldiamines include those represented by Formula (D)

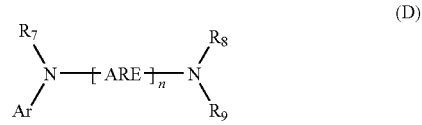

(D)

wherein:
  each ARE is an independently selected arylene group, such as a phenylene or anthracene moiety;
  n is an integer of from 1 to 4; and
  Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

Another class of the hole-transporting material comprises a material of formula (E):

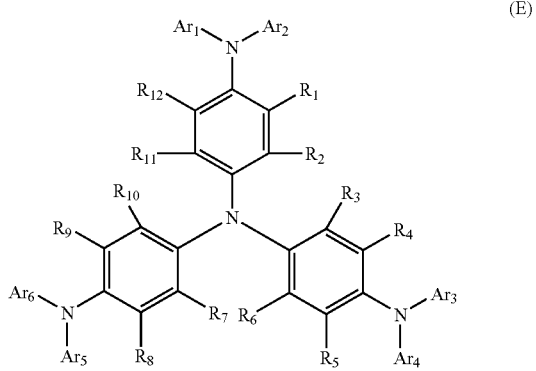

(E)

In formula (E), $Ar_1$-$Ar_6$ independently represent aromatic groups, for example, phenyl groups or tolyl groups;
$R_1$-$R_{12}$ independently represent hydrogen or independently selected substituent, for example an alkyl group containing from 1 to 4 carbon atoms, an aryl group, a substituted aryl group.

The various alkyl, alkylene, aryl, and arylene moieties of the foregoing structural Formulae (A), (B), (C), (D), and (E) can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. The aryl and arylene moieties are typically phenyl and phenylene moieties.

The HTL 132 is formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Aromatic tertiary amines are useful as hole-injecting materials also. Illustrative of useful aromatic tertiary amines are the following:

1,1-bis(4-di-p-tolylaminophenyl)cyclohexane;
1,1-bis(4-di-p-tolylaminophenyl)-4-phenylcyclohexane;
1,5-bis[N-(1-naphthyl)-N-phenylamino]naphthalene;
2,6-bis(di-p-tolylamino)naphthalene;
2,6-bis[di-(1-naphthyl)amino]naphthalene;
2,6-bis[N-(1-naphthyl)-N-(2-naphthyl)amino]naphthalene;
2,6-bis[N,N-di(2-naphthyl)amine]fluorene;
4-(di-p-tolylamino)-4'-[4(di-p-tolylamino)-styryl]stilbene;
4,4'-bis(diphenylamino)quadriphenyl;
4,4"-bis[N-(1-anthryl)-N-phenylamino]-p-terphenyl;
4,4'-bis[N-(1-coronenyl)-N-phenylamino]biphenyl;
4,4'-bis[N-(1-naphthyl)-N-phenylamino]biphenyl (NPB);
4,4'-bis[N-(1-naphthyl)-N-(2-naphthyl)amino]biphenyl (TNB);
4,4"-bis[N-(1-naphthyl)-N-phenylamino]p-terphenyl;
4,4'-bis[N-(2-naphthacenyl)-N-phenylamino]biphenyl;
4,4'-bis[N-(2-naphthyl)-N-phenylamino]biphenyl;
4,4'-bis[N-(2-perylenyl)-N-phenylamino]biphenyl;
4,4'-bis[N-(2-phenanthryl)-N-phenylamino]biphenyl;
4,4'-bis[N-(2-pyrenyl)-N-phenylamino]biphenyl;
4,4'-bis[N-(3-acenaphthenyl)-N-phenylamino]biphenyl;
4,4'-bis[N-(3-methylphenyl)-N-phenylamino]biphenyl (TPD);
4,4'-bis[N-(8-fluoranthenyl)-N-phenylamino]biphenyl;
4,4'-bis[N-(9-anthryl)-N-phenylamino]biphenyl;
4,4'-bis{N-phenyl-N-[4-(1-naphthyl)-phenyl]amino}biphenyl;
4,4'-bis[N-phenyl-N-(2-pyrenyl)amino]biphenyl;
4,4',4"-tris[(3-methylphenyl)phenylamino]triphenylamine (m-TDATA);
Bis(4-dimethylamino-2-methylphenyl)-phenylmethane;
N-phenylcarbazole;
N,N'-bis[4-([1,1'-biphenyl]-4-ylphenylamino)phenyl]-N,N'-di-1-naphthalenyl-[1,1'-biphenyl]-4,4'-diamine;
N,N'-bis[4-(di-1-naphthalenylamino)phenyl]-N,N'-di-1-naphthalenyl-[1,1'-biphenyl]-4,4'-diamine;
N,N'-bis[4-[(3-methylphenyl)phenylamino]phenyl]-N,N'-diphenyl-[1,1'-biphenyl]-4,4'-diamine;
N,N-bis[4-(diphenylamino)phenyl]-N',N'-diphenyl-[1,1'-biphenyl]-4,4'-diamine;
N,N'-di-1-naphthalenyl-N,N'-bis[4-(1-naphthalenylphenylamino)phenyl]-[1,1'-biphenyl]-4,4'-diamine;
N,N'-di-1-naphthalenyl-N,N'-bis[4-(2-naphthalenylphenylamino)phenyl]-[1,1'-biphenyl]-4,4'-diamine;
N,N,N-tri(p-tolyl)amine;
N,N,N',N'-tetra-p-tolyl-4-4'-diaminobiphenyl;
N,N,N',N'-tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl; and
N,N,N',N'-tetra(2-naphthyl)-4,4"-diamino-p-terphenyl.

Another class of useful hole-transporting materials includes polycyclic aromatic compounds as described in EP 1 009 041. Tertiary aromatic amines with more than two amine groups can be used including oligomeric materials. In addition, polymeric hole-transporting materials are used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The thickness of the HTL 132 is in the range of from 5 nm to 200 nm, preferably, in the range of from 10 nm to 150 nm.

Exciton Blocking Layer (EBL)

An optional exciton- or electron-blocking layer can be present between the HTL 132 and the LEL 134 (not shown in FIG. 1). Some suitable examples of such blocking layers are described in U.S. Publication 2006/0134460 A1.

Light Emitting Layer

The OLED device of the inventive contains a fluorescent green light-emitting layer comprising an anthracene host, a bis-diarylamino substituted anthracene as a dopant, and a quinacridone or biphenylstyrylamine stabilizer. Other LELs can be additionally present and the following discussion outlines appropriate LELs that can be used in combination with the inventive LEL.

As more fully described in U.S. Pat. Nos. 4,769,292 and 5,935,721, the light-emitting layer(s) (LEL) 134 of the organic EL element shown in FIG. 1 comprises a luminescent, fluorescent or phosphorescent material where electroluminescence is produced as a result of electron-hole pair recombination in this region. The light-emitting layer can be comprised of a single material, but more commonly consists of non-electroluminescent compounds (generally referred to as the host) doped with an electroluminescent guest compound (generally referred to as the dopant) or compounds where light emission comes primarily from the electroluminescent compound and can be of any color. Electroluminescent compounds can be coated as 0.01 to 50% into the non-electroluminescent component material, but typically coated as 0.01 to 30% and more typically coated as 0.01 to 15% into the non-electroluminescent component. The thickness of the LEL 134 can be any suitable thickness. It can be in the range of from 0.1 nm to 100 nm.

An important relationship for choosing a dye as a electroluminescent component is a comparison of the energy band gap which is defined as the energy difference between the highest occupied molecular orbital (HOMO) and the lowest unoccupied molecular orbital (LUMO) of the molecule. For efficient energy transfer from the non-electroluminescent compound to the electroluminescent compound molecule, a necessary condition is that the band gap of the electroluminescent compound is smaller than that of the non-electroluminescent compound or compounds. Thus, the selection of an appropriate host material is based on its electronic characteristics relative to the electronic characteristics of the electroluminescent compound, which itself is chosen for the nature and efficiency of the light emitted. As described below, fluorescent and phosphorescent dopants typically have different electronic characteristics so that the most appropriate hosts for each can be different. However in some cases, the same host material can be useful for either type of dopant.

Non-electroluminescent compounds and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

a) Phosphorescent Light Emitting Layers

Suitable hosts for phosphorescent LELs should be selected so that transfer of a triplet exciton can occur efficiently from the host to the phosphorescent dopant(s) but cannot occur efficiently from the phosphorescent dopant(s) to the host. Therefore, it is highly desirable that the triplet energy of the host be higher than the triplet energies of phosphorescent dopant. Generally speaking, a large triplet energy implies a large optical band gap. However, the band gap of the host should not be chosen so large as to cause an unacceptable barrier to injection of charges into the phosphorescent LEL and an unacceptable increase in the drive voltage of the OLED. The host in a phosphorescent LEL can include any of the aforementioned hole-transporting materials used for the HTL 132, as long as it has a triplet energy higher than that of the phosphorescent dopant in the layer. The host used in a phosphorescent LEL can be the same as or different from the hole-transporting material used in the HTL 132. In some cases, the host in the phosphorescent LEL can also suitably include an electron-transporting material (it will be discussed thereafter), as long as it has a triplet energy higher than that of the phosphorescent dopant.

In addition to the aforementioned hole-transporting materials in the HTL 132, there are several other classes of hole-transporting materials suitable for use as the host in a phosphorescent LEL or as a co-host in a fluorescent LEL.

One desirable host comprises a hole-transporting material of formula (F):

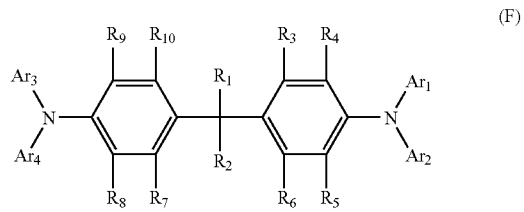

(F)

In formula (F), $R_1$ and $R_2$ represent substituents, provided that $R_1$ and $R_2$ can join to form a ring. For example, $R_1$ and $R_2$ can be methyl groups or join to form a cyclohexyl ring;

$Ar_1$-$Ar_4$ represent independently selected aromatic groups, for example phenyl groups or tolyl groups;

$R_3$-$R_{10}$ independently represent hydrogen, alkyl, substituted alkyl, aryl, substituted aryl group.

Examples of suitable materials include, but are not limited to:

1,1-Bis(4-(N,N-di-p-tolylamino)phenyl)cyclohexane (TAPC);

1,1-Bis(4-(N,N-di-p-tolylamino)phenyl)cyclopentane;

4,4'-(9H-fluoren-9-ylidene)bis[N,N-bis(4-methylphenyl)-benzenamine;

1,1-Bis(4-(N,N-di-p-tolylamino)phenyl)-4-phenylcyclohexane;

1,1-Bis(4-(N,N-di-p-tolylamino)phenyl)-4-methylcyclohexane;

1,1-Bis(4-(N,N-di-p-tolylamino)phenyl)-3-phenylpropane;

Bis[4-(N,N-diethylamino)-2-methylphenyl](4-methylphenyl)methane;

Bis[4-(N,N-diethylamino)-2-methylphenyl](4-methylphenyl)ethane;

4-(4-Diethylaminophenyl)triphenylmethane;

4,4'-Bis(4-diethylaminophenyl)diphenylmethane.

A useful class of triarylamines suitable for use as the host includes carbazole derivatives such as those represented by formula (G):

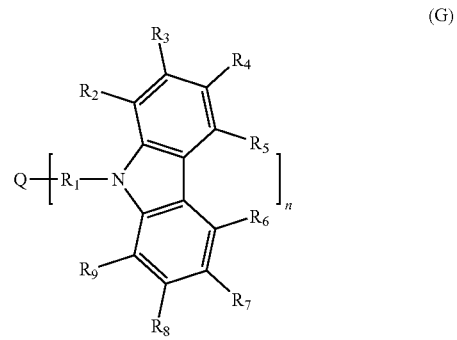

(G)

In formula (G), Q independently represents nitrogen, carbon, an aryl group, or substituted aryl group, preferably a phenyl group;

$R_1$ is preferably an aryl or substituted aryl group, and more preferably a phenyl group, substituted phenyl, biphenyl, substituted biphenyl group;

$R_2$ through $R_7$ are independently hydrogen, alkyl, phenyl or substituted phenyl group, aryl amine, carbazole, or substituted carbazole;

and n is selected from 1 to 4.

Another useful class of carbazoles satisfying structural formula (G) is represented by formula (H):

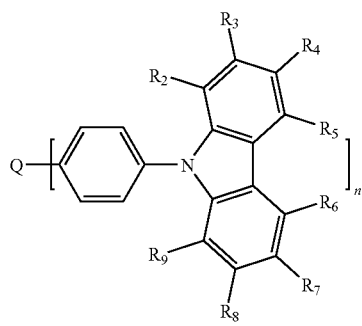

(H)

wherein:

n is an integer from 1 to 4;

Q is nitrogen, carbon, an aryl, or substituted aryl;

$R_2$ through $R_7$ are independently hydrogen, an alkyl group, phenyl or substituted phenyl, an aryl amine, a carbazole, and substituted carbazole.

Illustrative of useful substituted carbazoles are the following:

4-(9H-carbazol-9-yl)-N,N-bis[4-(9H-carbazol-9-yl)phenyl]-benzenamine (TCTA);

4-(3-phenyl-9H-carbazol-9-yl)-N,N-bis[4(3-phenyl-9H-carbazol-9-yl)phenyl]-benzenamine;

9,9'-[5'-[4-(9H-carbazol-9-yl)phenyl][1,1':3',1''-terphenyl]-4,4''-diyl]bis-9H-carbazole;

9,9'-(2,2'-dimethyl[1,1'-biphenyl]-4,4'-diyl)bis-9H-carbazole (CDBP);

9,9'-[1,1'-biphenyl]-4,4'-diylbis-9H-carbazole (CBP);

9,9'-(1,3-phenylene)bis-9H-carbazole (mCP);

9,9'-(1,4-phenylene)bis-9H-carbazole;

9,9∝,9''-(1,3,5-benzenetriyl)tris-9H-carbazole;

9,9'-(1,4-phenylene)bis[N,N,N',N'-tetraphenyl-9H-carbazole-3,6-diamine;

9-[4-(9H-carbazol-9-yl)phenyl]-N,N-diphenyl-9H-carbazol-3-amine;

9,9'-(1,4-phenylene)bis[N,N-diphenyl-9H-carbazol-3-amine;

9-[4-(9H-carbazol-9-yl)phenyl]-N,N,N',N'-tetraphenyl-9H-carbazole-3,6-diamine.

The above classes of hosts suitable for phosphorescent LELs can also be used as hosts in fluorescent LELs as well.

Suitable phosphorescent dopants for use in a phosphorescent LEL can be selected from the phosphorescent materials described by formula (J) below:

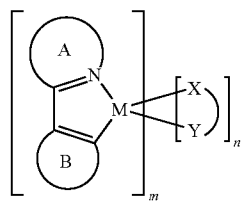

(J)

wherein:

A is a substituted or unsubstituted heterocyclic ring containing at least one nitrogen atom;

B is a substituted or unsubstituted aromatic or heteroaromatic ring, or ring containing a vinyl carbon bonded to M;

X—Y is an anionic bidentate ligand;

m is an integer from 1 to 3 and n in an integer from 0 to 2 such that m+n=3 for M=Rh or Ir; or m is an integer from 1 to 2 and n in an integer from 0 to 1 such that m+n=2 for M=Pt or Pd.

Compounds according to formula (J) can be referred to as C,N- (or C^N-) cyclometallated complexes to indicate that the central metal atom is contained in a cyclic unit formed by bonding the metal atom to carbon and nitrogen atoms of one or more ligands. Examples of heterocyclic ring A in formula (J) include substituted or unsubstituted pyridine, quinoline, isoquinoline, pyrimidine, indole, indazole, thiazole, and oxazole rings. Examples of ring B in formula (J) include substituted or unsubstituted phenyl, napthyl, thienyl, benzothienyl, furanyl rings. Ring B in formula (J) can also be a N-containing ring such as pyridine, with the proviso that the N-containing ring bonds to M through a C atom as shown in formula (J) and not the N atom.

An example of a tris-C,N-cyclometallated complex according to formula (J) with m=3 and n=0 is tris(2-phenyl-pyridinato-N,$C^{2'}$-)Iridium (III), shown below in stereodiagrams as facial (fac-) or meridional (mer-) isomers.

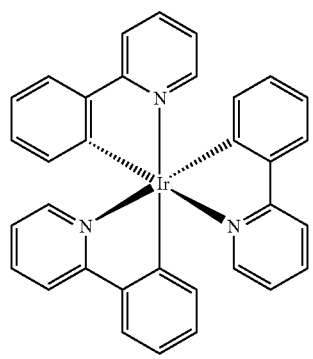

Fac

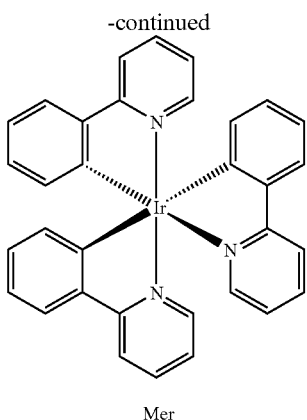

Mer

Generally, facial isomers are preferred since they are often found to have higher phosphorescent quantum yields than the meridional isomers. Additional examples of tris-C,N-cyclometallated phosphorescent materials according to formula (J) are tris(2-(4'-methylphenyl)pyridinato-N,C$^{2'}$)Iridium(III), tris(3-phenylisoquinolinato-N,C$^{2'}$)Iridium(III), tris(2-phenylquinolinato-N,C$^{2'}$)Iridium(III), tris(1-phenylisoquinolinato-N,C$^{2'}$)Iridium(III), tris(1-(4'-methylphenyl)isoquinolinato-N,C$^{2'}$)Iridium(III), tris(2-(4',6'-diflourophenyl)-pyridinato-N,C$^{2'}$)Iridium(III), tris(2-((5'-phenyl)-phenyl) pyridinato-N,C$^{2'}$)Iridium(III), tris(2-(2'-benzothienyl) pyridinato-N,C$^{3'}$)Iridium(III), tris(2-phenyl-3,3'dimethyl) indolato-N,C$^{2'}$)Ir(III), tris(1-phenyl-1H-indazolato-N,C$^{2'}$)Ir (III).

Of these, tris(1-phenylisoquinoline) iridium (III) (also referred to as Ir(piq)$_3$) and tris(2-phenylpyridine) iridium (also referred to as Tr(ppy)$_3$) are particularly suitable for this invention.

Tris-C,N-cyclometallated phosphorescent materials also include compounds according to formula (J) wherein the monoanionic bidentate ligand X—Y is another C,N-cyclometallating ligand. Examples include bis(1-phenylisoquinolinato-N,C$^{2'}$)(2-phenylpyridinato-N,C$^{2'}$)Iridium(III) and bis (2-phenylpyridinato-N,C$^{2'}$) (1-phenylisoquinolinato-N,C$^{2'}$) Iridium(III). Synthesis of such tris-C,N-cyclometallated complexes containing two different C,N-cyclometallating ligands can be conveniently synthesized by the following steps. First, a bis-C,N-cyclometallated diiridium dihalide complex (or analogous dirhodium complex) is made according to the method of Nonoyama (*Bull. Chem. Soc. Jpn.*, 47, 767 (1974)). Secondly, a zinc complex of the second, dissimilar C,N-cyclometallating ligand is prepared by reaction of a zinc halide with a lithium complex or Grignard reagent of the cyclometallating ligand. Third, the thus formed zinc complex of the second C,N-cyclometallating ligand is reacted with the previously obtained bis-C,N-cyclometallated diiridium dihalide complex to form a tris-C,N-cyclometallated complex containing the two different C,N-cyclometallating ligands. Desirably, the thus obtained tris-C,N-cyclometallated complex containing the two different C,N-cyclometallating ligands can be converted to an isomer wherein the C atoms bonded to the metal (e.g. Ir) are all mutually cis by heating in a suitable solvent such as dimethyl sulfoxide.

Suitable phosphorescent materials according to formula (J) can in addition to the C,N-cyclometallating ligand(s) also contain monoanionic bidentate ligand(s) X—Y that are not C,N-cyclometallating. Common examples are beta-diketonates such as acetylacetonate, and Schiff bases such as picolinate. Examples of such mixed ligand complexes according to formula (J) include bis(2-phenylpyridinato-N,C$^{2'}$)Iridium(II) (acetylacetonate), bis(2-(2'-benzothienyl)pyridinato-N,C$^{3'}$) Iridium(III)(acetylacetonate), and bis(2-(4',6'-diflourophenyl)-pyridinato-N,C$^{2'}$)Iridium(III)(picolinate).

Other important phosphorescent materials according to formula (J) include C,N-cyclometallated Pt(II) complexes such as cis-bis(2-phenylpyridinato-N,C$^{2'}$)platinum(II), cis-bis(2-(2'-thienyl)pyridinato-N,C$^{3'}$) platinum(II), cis-bis(2-(2'-thienyl)quinolinato-N,C$^{5'}$) platinum(II), or (2-(4',6'-difluorophenyl)pyridinato-N,C$^{2'}$) platinum (TI) (acetylacetonate).

The emission wavelengths (color) of C,N-cyclometallated phosphorescent materials according to formula (J) are governed principally by the lowest energy optical transition of the complex and hence by the choice of the C,N-cyclometallating ligand. For example, 2-phenyl-pyridinato-N,C$^{2'}$ complexes are typically green emissive while 1-phenyl-isoquinolinolato-N,C$^{2'}$ complexes are typically red emissive. In the case of complexes having more than one C,N-cyclometallating ligand, the emission will be that of the ligand having the property of longest wavelength emission. Emission wavelengths can be further shifted by the effects of substituent groups on the C,N-cyclometallating ligands. For example, substitution of electron donating groups at appropriate positions on the N-containing ring A or electron accepting groups on the C-containing ring B tend to blue-shift the emission relative to the unsubstituted C,N-cyclometallated ligand complex. Selecting a monodentate anionic ligand X,Y in formula (J) having more electron accepting properties also tends to blue-shift the emission of a C,N-cyclometallated ligand complex. Examples of complexes having both monoanionic bidentate ligands possessing electron accepting properties and electron accepting substituent groups on the C-containing ring B include bis(2-(4',6'-difluorophenyl)-pyridinato-N,C$^{2'}$)iridium(III)(picolinate) and bis(2-(4',6'-difluorophenyl)-pyridinato-N,C$^{2'}$)iridium(III)(tetrakis(1-pyrazolyl)borate).

The central metal atom in phosphorescent materials according to formula (J) can be Rh or Ir (m+n=3) and Pd or Pt (m+n=2). Preferred metal atoms are Ir and Pt since they tend to give higher phosphorescent quantum efficiencies according to the stronger spin-orbit coupling interactions generally obtained with elements in the third transition series.

In addition to bidentate C,N-cyclometallating complexes represented by formula (J), many suitable phosphorescent materials contain multidentate C,N-cyclometallating ligands. Phosphorescent materials having tridentate ligands suitable for use in the present invention are disclosed in U.S. Pat. No. 6,824,895 B1 and references therein. Phosphorescent materials having tetradentate ligands suitable for use in the present invention are described by the following formulae:

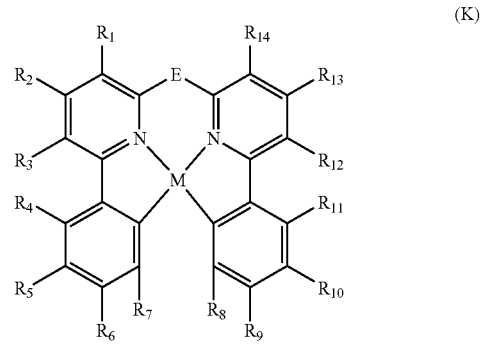

(K)

-continued

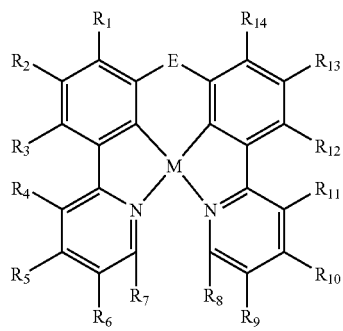

(L)

wherein:

M is Pt or Pd;

R$^1$-R$^7$ represent hydrogen or independently selected substituents, provided that R$^1$ and R$^2$, R$^2$ and R$^3$, R$^3$ and R$^4$ R$^4$ and R$^5$, R$^5$ and R$^6$, as well as R$^6$ and R$^7$ can join to form a ring group;

R$^8$-R$^{14}$ represent hydrogen or independently selected substituents, provided that R$^8$ and R$^9$, R$^9$ and R$^{10}$, R$^{10}$ and R$^{11}$, R$^{11}$ and R$^{12}$, R$^{12}$ and R$^{13}$, as as R$^{13}$ and R$^{14}$, can join to form a ring group;

E represents a bridging group selected from the following:

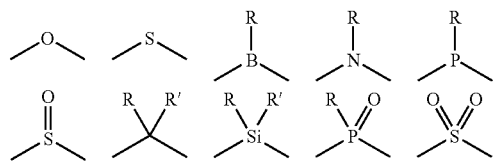

wherein:

R and R' represent hydrogen or independently selected substituents; provided R and R' can combine to form a ring group.

One desirable tetradentate C,N-cyclometallated phosphorescent material suitable for use in as the phosphorescent dopant is represented by the following formula:

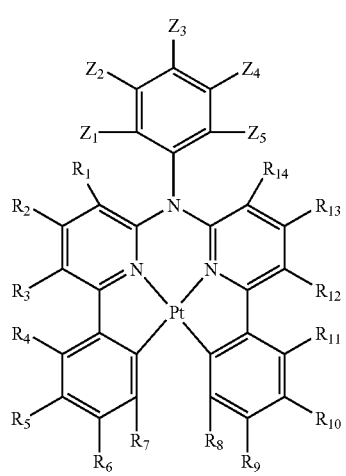

(M)

wherein:

R$^1$-R$^7$ represent hydrogen or independently selected substituents, provided that R$^1$ and R$^2$, R$^2$ and R$^3$, R$^3$ and R$^4$ R$^4$ and R$^5$, R$^5$ and R$^6$, as well as R$^6$ and R$^7$ can combine to form a ring group;

R$^8$-R$^{14}$ represent hydrogen or independently selected substituents, provided that R$^8$ and R$^9$, R$^9$ and R$^{10}$, R$^{10}$ and R$^{11}$, R$^{11}$ and R$^{12}$, R$^{12}$ and R$^{13}$, as as R$^{13}$ and R$^{14}$ can combine to form a ring group;

Z$^1$-Z$^5$ represent hydrogen or independently selected substituents, provided that Z$^1$ and Z$^2$, Z$^2$ and Z$^3$, Z$^3$ and Z$^4$, as well as Z$^4$ and Z$^5$ can combine to form a ring group.

Specific examples of phosphorescent materials having tetradentate C,N-cyclometallating ligands suitable for use in the present invention include compounds (M-1), (M-2) and (M-3) represented below.

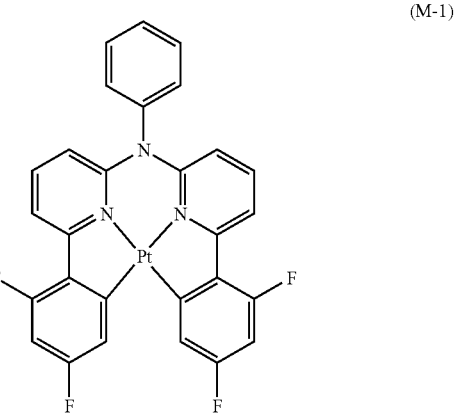

(M-1)

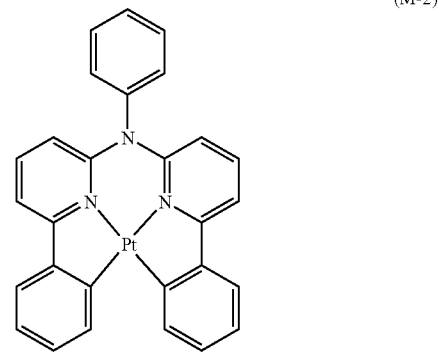

(M-2)

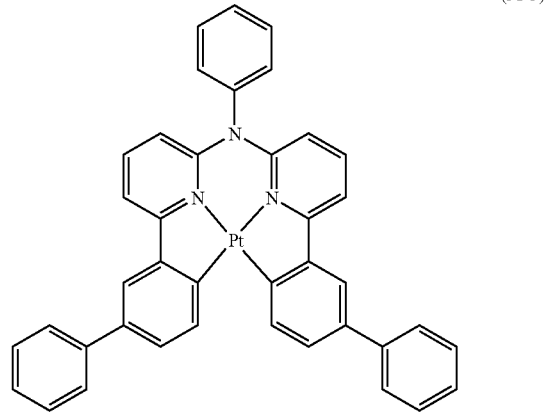

(M-3)

Phosphorescent materials having tetradentate C,N-cyclometallating ligands can be synthesized by reacting the tetradentate C,N-cyclometallating ligand with a salt of the desired metal, such as $K_2PtCl_4$, in a proper organic solvent such as glacial acetic acid to form the phosphorescent material having tetradentate C,N-cyclometallating ligands. A tetraalkylammonium salt such as tetrabutylammonium chloride can be used as a phase transfer catalyst to accelerate the reaction.

Other phosphorescent materials that do not involve C,N-cyclometallating ligands are known. Phosphorescent complexes of Pt(II), Ir(I), and Rh(I) with maleonitriledithiolate have been reported (Johnson et al., *J. Am. Chem. Soc.*, 105, 1795 (1983)). Re(I) tricarbonyl diimine complexes are also known to be highly phosphorescent (Wrighton and Morse, *J. Am. Chem. Soc.*, 96, 998 (1974); Stufkens, *Comments Inorg. Chem.*, 13, 359 (1992); Yam, *Chem. Commun.*, 789 (2001)). Os(II) complexes containing a combination of ligands including cyano ligands and bipyridyl or phenanthroline ligands have also been demonstrated in a polymer OLED (Ma et al., *Synthetic Metals*, 94, 245 (1998)).

Porphyrin complexes such as 2,3,7,8,12,13,17,18-octaethyl-21H, 23H-porphine platinum(II) are also useful phosphorescent dopant.

Still other examples of useful phosphorescent materials include coordination complexes of the trivalent lanthanides such as $Tb^{3-}$ and $Eu^{3+}$ (Kido et al., *Chem. Lett.*, 657 (1990); *J. Alloys and Compounds*, 192, 30 (1993); *Jpn. J. Appl. Phys.*, 35, L394 (1996) and *Appl. Phys. Lett.*, 65, 2124 (1994)).

The phosphorescent dopant in a phosphorescent LEL is typically present in an amount of from 1 to 20% by volume of the LEL, and conveniently from 2 to 8% by volume of the LEL. In some embodiments, the phosphorescent dopant(s) can be attached to one or more host materials. The host materials can further be polymers. The phosphorescent dopant in the first phosphorescent light-emitting layer is selected from green and red phosphorescent materials.

The thickness of a phosphorescent LEL is greater than 0.5 nm, preferably, in the range of from 1.0 nm to 40 nm.

b) Fluorescent Light Emitting Layers

Although the term "fluorescent" is commonly used to describe any light-emitting material, in this case it refers to a material that emits light from a singlet excited state. Fluorescent materials can be used in the same layer as the phosphorescent material, in adjacent layers, in adjacent pixels, or any combination. Care should be taken not to select materials that will adversely affect the performance of the phosphorescent materials of this invention. One skilled in the art will understand that concentrations and triplet energies of materials in the same layer as the phosphorescent material or in an adjacent layer should be appropriately set so as to prevent unwanted quenching of the phosphorescence.

Typically, a fluorescent LEL includes at least one host and at least one fluorescent dopant. The host can be a hole-transporting material or any of the suitable hosts for phosphorescent dopants as defined above or can be an electron-transporting material as defined below.

The dopant is typically chosen from highly fluorescent dyes, e.g., transition metal complexes as described in WO 98/55561 A1, WO 00/18851 A1, WO 00/57676 A1, and WO 00/70655.

Useful fluorescent dopants include, but are not limited to, derivatives of anthracene, tetracene, xanthene, perylene, phenylene, dicyanomethylenepyran compounds, thiopyran compounds, polymethine compounds, pyrylium and thiapyrylium compounds, arylpyrene compounds, arylenevinylene compounds, periflanthene derivatives, indenoperylene derivatives, bis(azinyl)amine boron compounds, bis(azinyl) methane boron compounds, distyrylbenzene derivatives, distyrylbiphenyl derivatives, distyrylamine derivatives and carbostyryl compounds.

Some fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane compounds (as described in U.S. Pat. No. 5,121,029) and carbostyryl compounds. Illustrative examples of useful materials include, but are not limited to, the following:

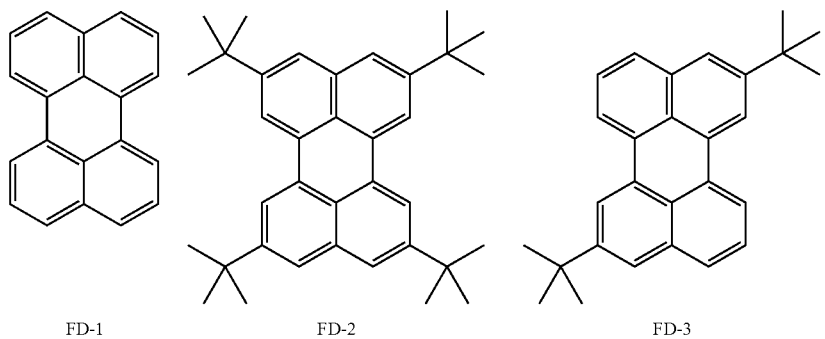

FD-1  FD-2  FD-3

-continued
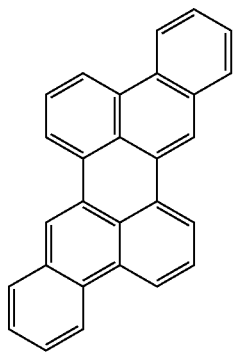
FD-4
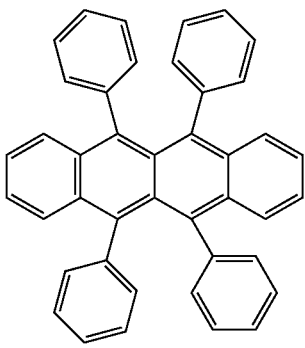
FD-5
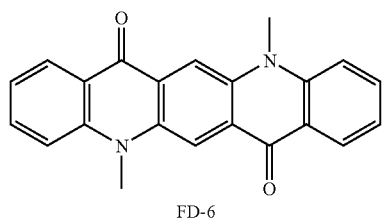
FD-6
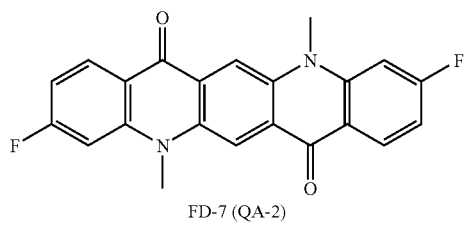
FD-7 (QA-2)
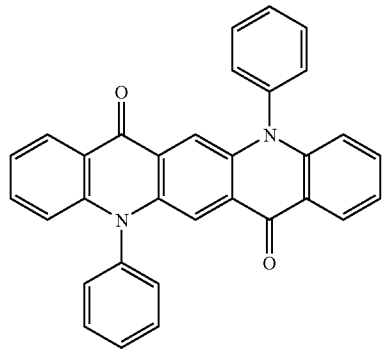
FD-8 (QA-1)
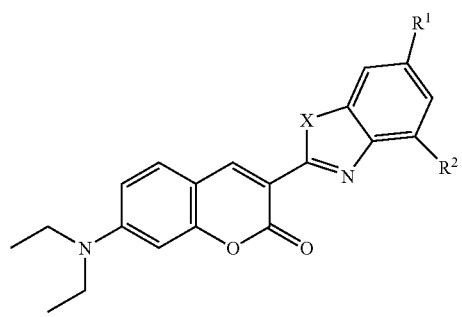
| | X | R1 | R2 |
|---|---|---|---|
| FD-9 | O | H | H |
| FD-10 | O | H | Methyl |
| FD-11 | O | Methyl | H |

-continued

| | | | |
|---|---|---|---|
| FD-12 | O | Methyl | Methyl |
| FD-13 | O | H | t-butyl |
| FD-14 | O | t-butyl | H |
| FD-15 | O | t-butyl | t-butyl |
| FD-16 | S | H | H |
| FD-17 | S | H | Methyl |
| FD-18 | S | Methyl | H |
| FD-19 | S | Methyl | Methyl |
| FD-20 | S | H | t-butyl |
| FD-21 | S | t-butyl | H |
| FD-22 | S | t-butyl | t-butyl |

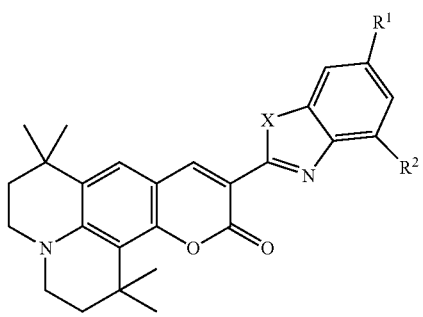

| | X | R1 | R2 |
|---|---|---|---|
| FD-23 | O | H | H |
| FD-24 | O | H | Methyl |
| FD-25 | O | Methyl | H |
| FD-26 | O | Methyl | Methyl |
| FD-27 | O | H | t-butyl |
| FD-28 | O | t-butyl | H |
| FD-29 | O | t-butyl | t-butyl |
| FD-30 | S | H | H |
| FD-31 | S | H | Methyl |
| FD-32 | S | Methyl | H |
| FD-33 | S | Methyl | Methyl |
| FD-34 | S | H | t-butyl |
| FD-35 | S | t-butyl | H |
| FD-36 | S | t-butyl | t-butyl |

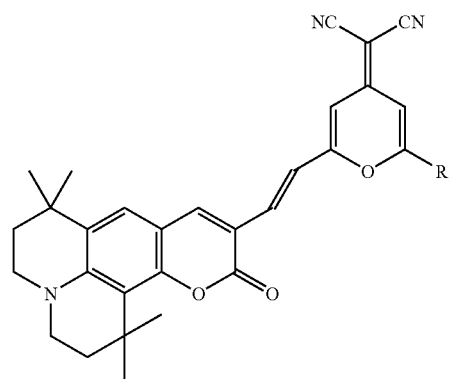

| | R |
|---|---|
| FD-37 | phenyl |
| FD-38 | methyl |
| FD-39 | t-butyl |
| FD-40 | mesityl |

-continued
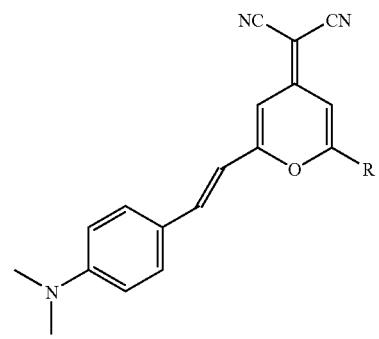
| | R |
|---|---|
| FD-41 | phenyl |
| FD-42 | methyl |
| FD-43 | t-butyl |
| FD-44 | mesityl |
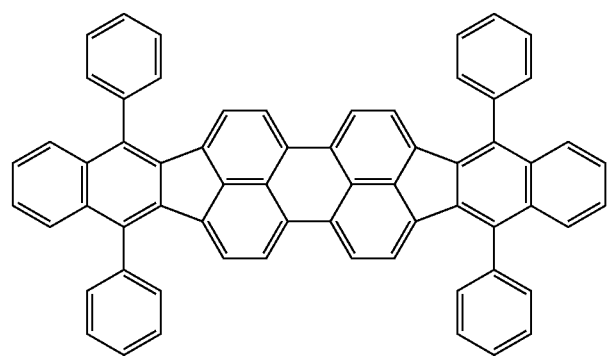
FD-46
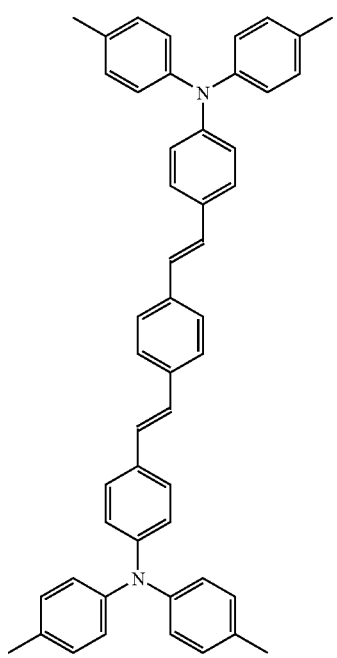
FD-47
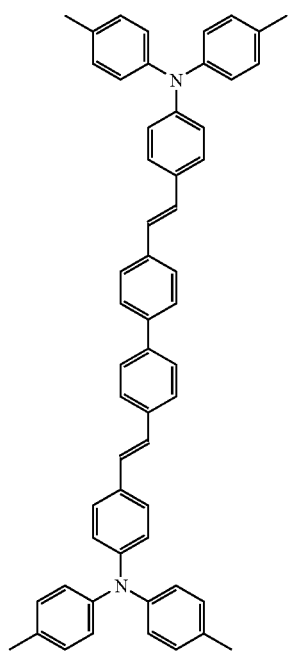
FD-48

-continued
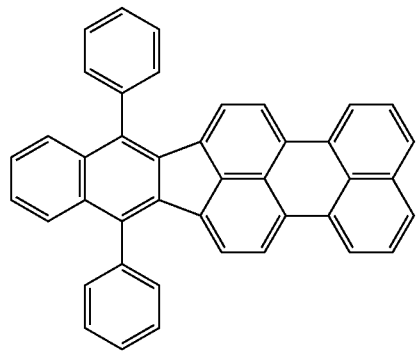
FD-49
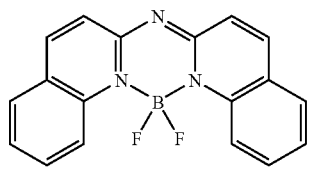
FD-50
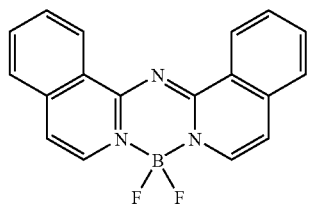
FD-51
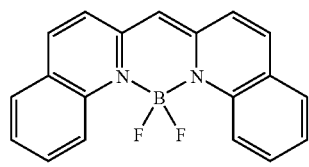
FD-52
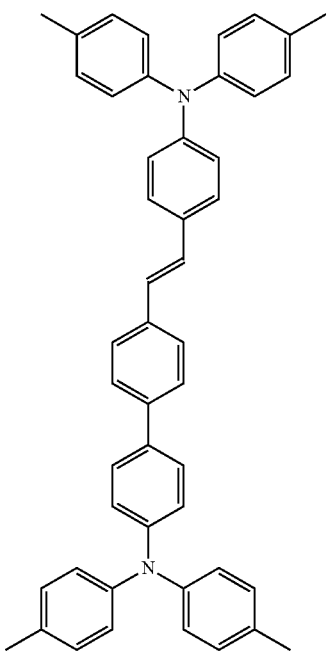
FD-53 (BSA-2)
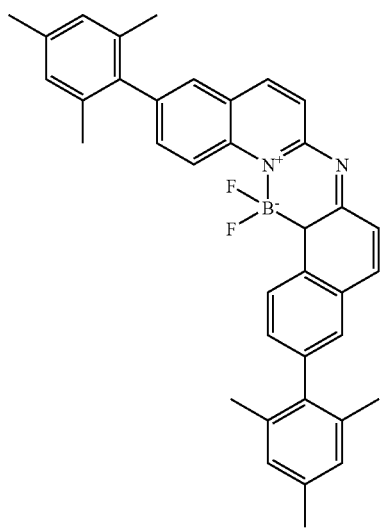
FD-54
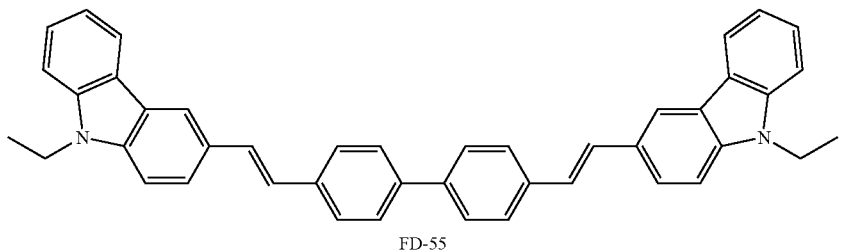
FD-55

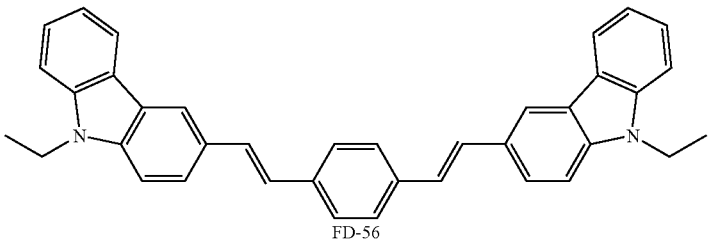
FD-56

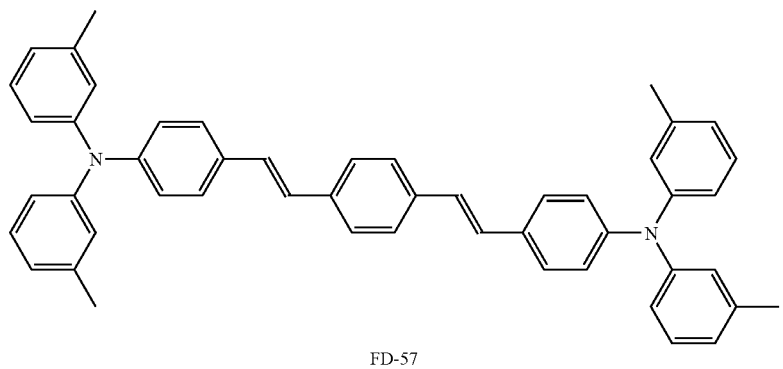
FD-57

Preferred fluorescent blue dopants can be found in Chen, Shi, and Tang, "Recent Developments in Molecular Organic Electroluminescent Materials," *Macromol. Symp.* 125, 1 (1997) and the references cited therein; Hung and Chen, "Recent Progress of Molecular Organic Electroluminescent Materials and Devices," *Mat. Sci. and Eng. R*39, 143 (2002) and the references cited therein.

A particularly preferred class of blue-emitting fluorescent dopants is represented by Formula (N), known as a bis(azinyl-amine) borane complex, and is described in U.S. Pat. No. 6,661,023.

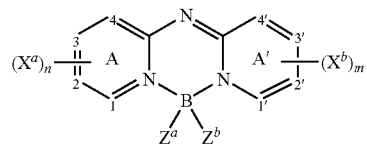

Formula (N)

wherein:
A and A' represent independent azine ring systems corresponding to 6-membered aromatic ring systems containing at least one nitrogen;
each $X^a$ and $X^b$ is an independently selected substituent, two of which can join to form a fused ring to A or A';
m and n are independently 0 to 4;
$Z^a$ and $Z^b$ are independently selected substituents; and
1, 2, 3, 4, 1', 2', 3', and 4' are independently selected as either carbon or nitrogen atoms.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring. Desirably, $Z^a$ and $Z^b$ are fluorine atoms.

Preferred embodiments further include devices where the two fused ring systems are quinoline or isoquinoline systems; the aryl or heterocyclic substituent is a phenyl group; there are present at least two $X^a$ groups and two $X^b$ groups which join to form a 6-6 fused ring, the fused ring systems are fused at the 1-2, 3-4, 1'-2', or 3'-4' positions, respectively; one or both of the fused rings is substituted by a phenyl group; and where the dopant is depicted in Formulae (N-a), (N-b), or (N-c).

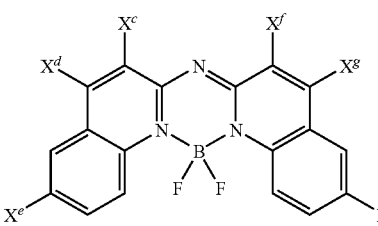

Formula (N-a)

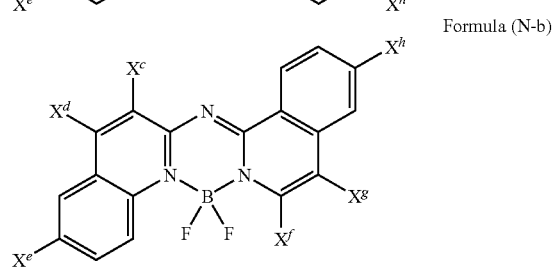

Formula (N-b)

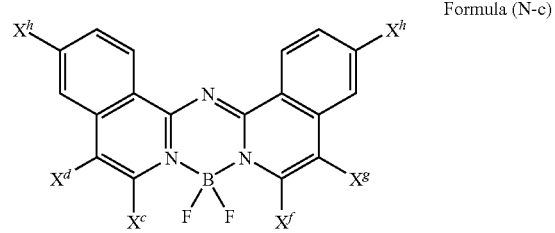

Formula (N-c)

wherein:
each $X^c$, $X^d$, $X^e$, $X^f$, $X^g$, and $X^h$ is hydrogen or an independently selected substituent, one of which should be an aryl or heterocyclic group.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring, and one is an aryl or substituted aryl group. Desirably, $Z^a$ and $Z^b$ are fluorine atoms. Of these, compound FD-54 is particularly useful.

Formula (N-d) below represents another class of green-emitting dopants useful in the invention.

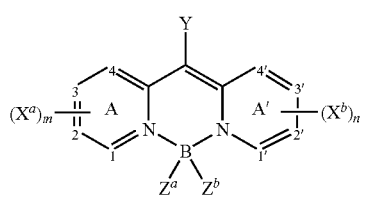

Formula (N-d)

wherein:
A and A' represent independent azine ring systems corresponding to 6-membered aromatic ring systems containing at least one nitrogen;
each $X^a$ and $X^b$ is an independently selected substituent, two of which can join to form a fused ring to A or A';
m and n are independently 0 to 4;
Y is H or a substituent;
$Z^a$ and $Z^b$ are independently selected substituents; and
1, 2, 3, 4, 1', 2', 3', and 4' are independently selected as either carbon or nitrogen atoms.

In the device, 1, 2, 3, 4, 1', 2', 3', and 4' are conveniently all carbon atoms. The device can desirably contain at least one or both of ring A or A' that contains substituents joined to form a fused ring. In one useful embodiment, there is present at least one $X^a$ or $X^b$ group selected from the group consisting of halide and alkyl, aryl, alkoxy, and aryloxy groups. In another embodiment, there is present a $Z^a$ and $Z^b$ group independently selected from the group consisting of fluorine and alkyl, aryl, alkoxy and aryloxy groups. A desirable embodiment is where $Z^a$ and $Z^b$ are F. Y is suitably hydrogen or a substituent such as an alkyl, aryl, or heterocyclic group.

The emission wavelength of these compounds can be adjusted to some extent by appropriate substitution around the central bis(azinyl)methene boron group to meet a color aim, namely green. Some examples of useful material are FD-50, FD-51 and FD-52.

Coumarins represent a useful class of green-emitting dopants as described by Tang et al. in U.S. Pat. Nos. 4,769,292 and 6,020,078. Green dopants or light-emitting materials can be coated as 0.01 to 50% by weight into the host material, but typically coated as 0.01 to 30% and more typically coated as 0.01 to 15% by weight into the host material. Examples of useful green-emitting coumarins include FD-30 and FD-30B.

In this invention, quinacridones are used as stabilizer compounds. However in other LELs, quinacridones represent another useful class of green-emitting dopants. Examples of particularly useful green-emitting quinacridones are FD-7 (QA-2) and FD-8 (QA-1).

Naphthacenes and derivatives thereof also represent a useful class of emitting dopants, which can also be used as stabilizers. These dopant materials can be coated as 0.01 to 50% by weight into the host material, but typically coated as 0.01 to 30% and more typically coated as 0.01 to 15% by weight into the host material. Naphthacene derivative YD-1 (t-BuDPN) below, is an example of a dopant material used as a stabilizer.

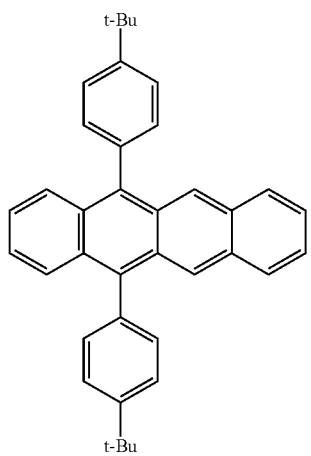

YD-1

Some examples of this class of materials are also suitable as host materials as well as dopants. For example, see U.S. Pat. Nos. 6,773,832 or 6,720,092. A specific example of this would be rubrene (FD-5).

Another class of useful dopants is perylene derivatives; for example see U.S. Pat. No. 6,689,493. A specific examples is FD-46.

Metal complexes of 8-hydroxyquinoline and similar derivatives (Formula O) constitute one class of useful non-electroluminescent host compounds capable of supporting electroluminescence, and are particularly suitable for light emission of wavelengths longer than 500 nm, e.g., green, yellow, orange, and red.

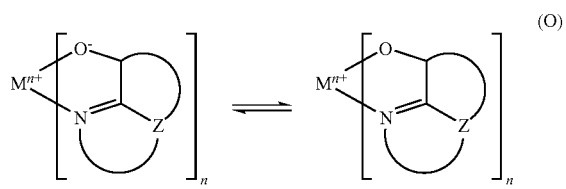

(O)

wherein:
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such as aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

O-1: Aluminum trisoxine[alias, tris(8-quinolinolato)aluminum(III)]

O-2: Magnesium bisoxine[alias, bis(8-quinolinolato)magnesium(II)]

O-3: Bis[benzo{f}-8-quinolinolato]zinc (II)

O-4: Bis(2-methyl-8-quinolinolato)aluminum(III)-p-oxo-bis(2-methyl-8-quinolinolato)aluminum(III)

O-5: Indium trisoxine[alias, tris(8-quinolinolato)indium]

O-6: Aluminum tris(5-methyloxine)[alias, tris(5-methyl-8-quinolinolato)aluminum(III)]

O-7: Lithium oxine[alias, (8-quinolinolato)lithium(I)]

O-8: Gallium oxine[alias, tris(8-quinolinolato)gallium(III)]

O-9: Zirconium oxine[alias, tetra(8-quinolinolato)zirconium (IV)]

O-10: Bis(2-methyl-8-quinolinato)-4-phenylphenolatoaluminum (III)

Anthracene derivatives according to formula (P) are also useful host materials in the LEL:

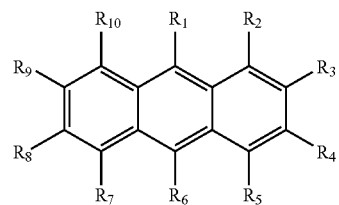

(P)

wherein:

$R_1$-$R_{10}$ are independently chosen from hydrogen, alkyl groups from 1-24 carbon atoms or aromatic groups from 6-24 carbon atoms. Particularly preferred are compounds where $R_1$ and $R_6$ are phenyl, biphenyl or naphthyl, $R_3$ is phenyl, substituted phenyl or naphthyl and $R_2$, $R_4$, $R_5$, $R_7$-$R_{10}$ are all hydrogen. Such anthracene hosts are known to have excellent electron transporting properties. Particularly desirable are derivatives of 9,10-di-(2-naphthyl)anthracene. Illustrative examples include 9,10-di-(2-naphthyl)anthracene (ADN) and 2-t-butyl-9,10-di-(2-naphthyl)anthracene (TBADN). Other anthracene derivatives can be useful as a non-electroluminescent compound in the LEL, such as diphenylanthracene and its derivatives, as described in U.S. Pat. No. 5,927,247. Styrylarylene derivatives as described in U.S. Pat. No. 5,121,029 and JP 08333569 are also useful non-electroluminescent materials. For example, 9,10-bis[4-(2,2-diphenylethenyl)phenyl]anthracene, 4,4'-Bis(2,2-diphenylethenyl)-1,1'-biphenyl (DPVBi) and phenylanthracene derivatives as described in EP 681,019 are useful non-electroluminescent materials. Anthracenes P-1-P-5 can also serve as suitable hosts for non-inventive LELs.

Another useful class of electron-transporting hosts for fluorescent and phosphorescent LELs are those derived from gallium complexes with nitrogen bidentate ligands. Two illustrative examples of such gallium complexes are:

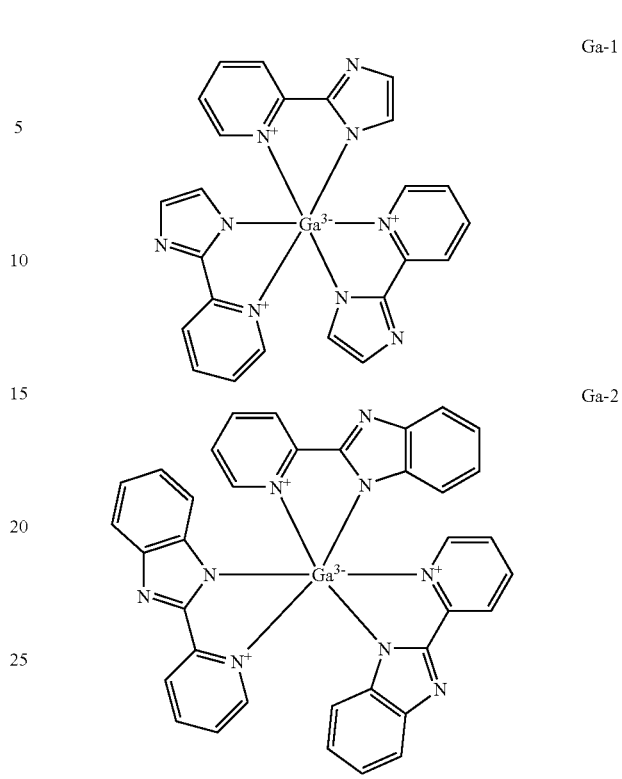

Spacer Layer

Spacer layers, when present, are located in direct contact to an LEL. They can be located on either the anode or cathode, or even both sides of the LEL. They typically do not contain any light-emissive dopants. One or more materials can be used and could be either a hole-transporting material as defined above or an electron-transporting material as defined below. If located next to a phosphorescent LEL, the material in the spacer layer should have equal or higher triplet energy than that of the phosphorescent dopant in the LEL. The material in the spacer layer can be the same as what is used as the host in the adjacent LEL. Thus, any of the host materials described are also suitable for use in a spacer layer. The spacer layer should be thin; at least 0.1 nm, but preferably in the range of from 1.0 nm to 20 nm.

Hole-Blocking Layer (HBL)

When an LEL containing a phosphorescent emitter is present, it is desirable to locate a hole-blocking layer 135 between the electron-transporting layer 136 and the light-emitting layer 134 to help confine the excitons and recombination events to the LEL. In this case, there should be a sufficient energy barrier for hole migration from the hole transporting co-host(s) or emitter into the hole-blocking layer 135, while electrons should pass readily from the hole-blocking layer into the light-emitting layer comprising co-host materials and a phosphorescent emitter. It is further desirable that the triplet energy of the hole-blocking material be greater than that of the phosphorescent material. Suitable hole-blocking materials are described in WO 00/70655A2, WO 01/41512 and WO 01/93642 A1. Two examples of useful hole-blocking materials are bathocuproine (BCP) and bis(2-methyl-8-quinolinolato)(4-phenylphenolato)aluminum(III) (BAlq). Metal complexes other than BAlq are also known to block holes and excitons as described in U.S. 2003/0068528. When a hole-blocking layer is used, its thickness can be between 2 and 100 nm and suitably between 5 and 10 nm.

Electron Transporting Layer

In addition to any of the electron-transporting materials previously described any other materials known to be suitable for use in the ETL can be used. Included are, but are not limited to, chelated oxinoid compounds, anthracene derivatives, pyridine-based materials, imidazoles, oxazoles, thiazoles and their derivatives, polybenzobisazoles, cyano-containing polymers and perfluorinated materials. Other electron-transporting materials include various butadiene derivatives as disclosed in U.S. Pat. No. 4,356,429 and various heterocyclic optical brighteners as described in U.S. Pat. No. 4,539,507.

A preferred class of benzazoles is described by Shi et al. in U.S. Pat. Nos. 5,645,948 and 5,766,779. Such compounds are represented by structural formula (Q):

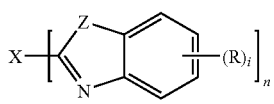

(Q)

In formula (Q), n is selected from 2 to 8 and i is selected from 1-5;

Z is independently O, NR or S;

R is individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring; and X is a linkage unit consisting of carbon, alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole] (TPBI) represented by a formula (Q-1) shown below:

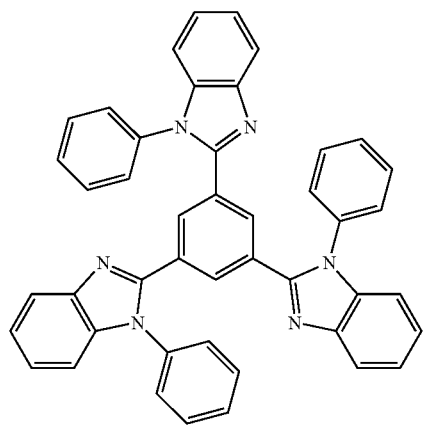

(Q-1)

Another suitable class of the electron-transporting materials includes various substituted phenanthrolines as represented by formula (R).

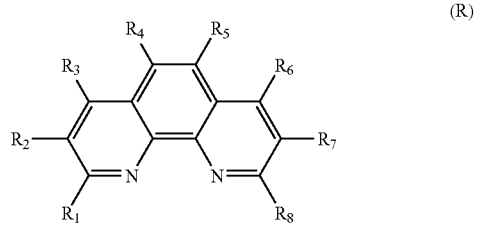

(R)

In formula (R), $R_1$-$R_8$ are independently hydrogen, alkyl group, aryl or substituted aryl group, and at least one of $R_1$-$R_8$ is aryl group or substituted aryl group.

Specific examples of the phenanthrolines useful in the EIL are 2,9-dimethyl-4,7-diphenyl-phenanthroline (BCP) (see formula (R-1)) and 4,7-diphenyl-1,10-phenanthroline (Bphen) (see formula (R-2)).

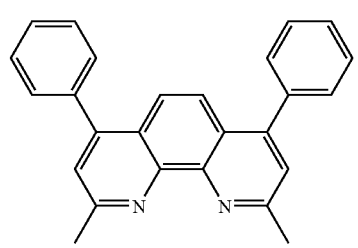

(R-1)

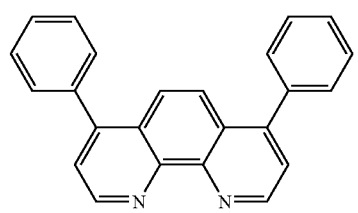

(R-2)

Suitable triarylboranes that function as an electron-transporting material can be selected from compounds having the chemical formula (S):

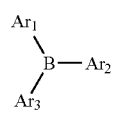

(S)

wherein:

$Ar_1$ to $Ar_3$ are independently an aromatic hydrocarbocyclic group or an aromatic heterocyclic group which can have a substituent. It is preferable that compounds having the above structure are selected from formula (S-1):

(S-1)

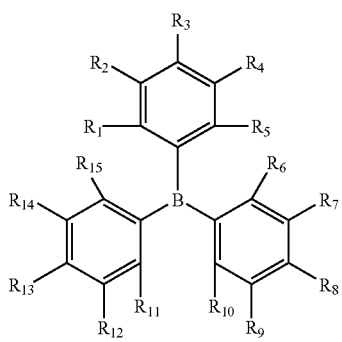

wherein:

$R_1$-$R_{15}$ are independently hydrogen, fluoro, cyano, trifluoromethyl, sulfonyl, alkyl, aryl or substituted aryl group.

Specific representative embodiments of the triarylboranes include:

(S-1)

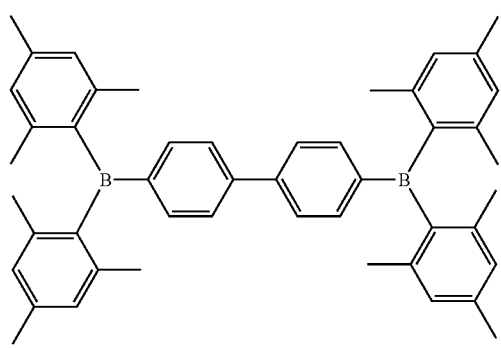

(S-2)

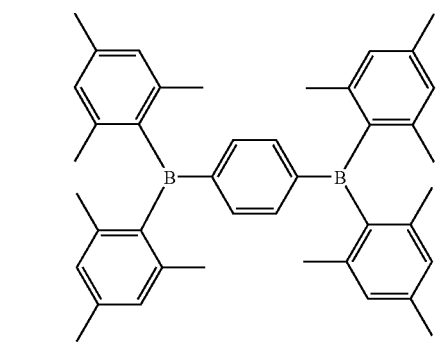

(S-3)

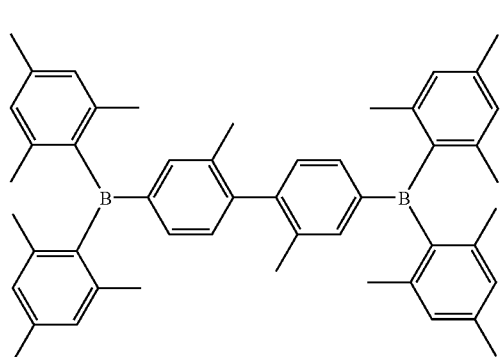

The electron-transporting material can also be selected from substituted 1,3,4-oxadiazoles of formula (T):

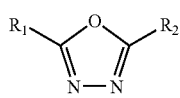
(T)

wherein:

$R_1$ and $R_2$ are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring.

Illustrative of the useful substituted oxadiazoles are the following:

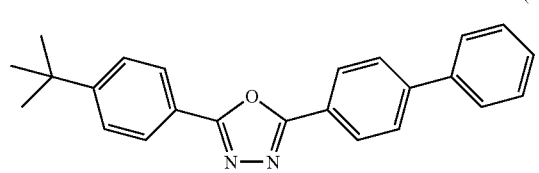
(T-1)

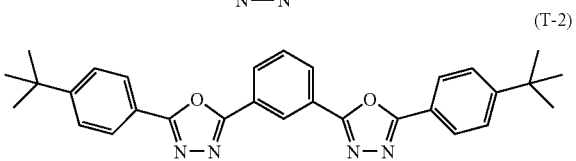
(T-2)

The electron-transporting material can also be selected from substituted 1,2,4-triazoles according to formula (U):

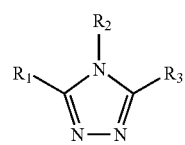
(U)

wherein:

$R_1$, $R_2$ and $R_3$ are independently hydrogen, alkyl group, aryl or substituted aryl group, and at least one of $R_1$-$R_3$ is aryl group or substituted aryl group. An example of a useful triazole is 3-phenyl-4-(1-naphtyl)-5-phenyl-1,2,4-triazole represented by formula (U-1):

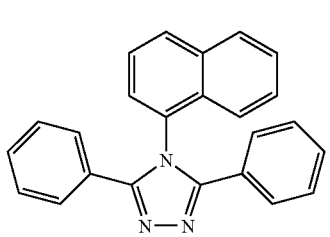
(U-1)

The electron-transporting material can also be selected from substituted 1,3,5-triazines. Examples of suitable materials are:

2,4,6-tris(diphenylamino)-1,3,5-triazine;
2,4,6-tricarbazolo-1,3,5-triazine;
2,4,6-tris(N-phenyl-2-naphthylamino)-1,3,5-triazine;
2,4,6-tris(N-phenyl-1-naphthylamino)-1,3,5-triazine;
4,4',6,6'-tetraphenyl-2,2'-bi-1,3,5-triazine;
2,4,6-tris([1,1':3',1''-terphenyl]-5'-yl)-1,3,5-triazine.

In addition, any of the metal chelated oxinoid compounds including chelates of oxine itself (also commonly referred to as 8-quinolinol or 8-hydroxyquinoline) of Formula (O) useful as host materials in a LEL are also suitable for use in the ETL.

Some metal chelated oxinoid compounds having high triplet energy can be particularly useful as an electron-transporting materials. Particularly useful aluminum or gallium complex host materials with high triplet energy levels are represented by Formula (V).

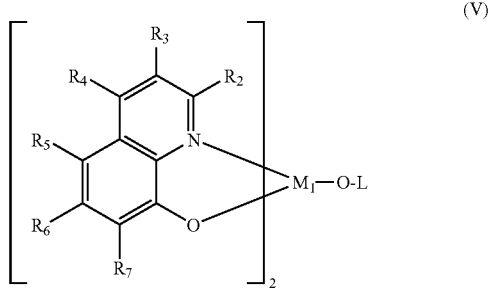

In Formula (V), $M_1$ represents Al or Ga. $R_2$-$R_7$ represent hydrogen or an independently selected substituent. Desirably, $R_2$ represents an electron-donating group. Suitably, $R_3$ and $R_4$ each independently represent hydrogen or an electron donating substituent. A preferred electron-donating group is alkyl such as methyl. Preferably, $R_5$, $R_6$, and $R_7$ each independently represent hydrogen or an electron-accepting group. Adjacent substituents, $R_2$-$R_7$, can combine to form a ring group. L is an aromatic moiety linked to the aluminum by oxygen, which can be substituted with substituent groups such that L has from 6 to 30 carbon atoms.

Illustrative of useful chelated oxinoid compounds for use in the ETL is Aluminum(III) bis(2-methyl-8-hydroxyquinoline)-4-phenylphenolate [alias, BAlq].

The same anthracene derivatives according to formula (P) useful as host materials in the LEL can also be used in the ETL.

The thickness of the ETL is in the range of from 5 nm to 200 nm, preferably, in the range of from 10 nm to 150 nm.

Electron Injection Layer

In some embodiments of the invention, an alkali metal compound such as LiF or an organic lithium compound is present in the EIL (138). Other suitable materials can also be used in the EIL. For example, the EIL can be an n-type doped layer containing at least one electron-transporting material as a host and at least one n-type dopant. The dopant is capable of reducing the host by charge transfer. The term "n-type doped layer" means that this layer has semiconducting properties after doping, and the electrical current through this layer is substantially carried by the electrons.

The host in the EIL can be an electron-transporting material capable of supporting electron injection and electron transport. The electron-transporting material can be selected from the electron-transporting materials for use in the ETL region as defined above.

The n-type dopant in the n-type doped EIL can be is selected from alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their compounds, are particularly useful. The materials used as the n-type dopants in the n-type doped EIL also include organic reducing agents with strong electron-donating properties. By "strong electron-donating properties" it is meant that the organic dopant should be able to donate at least some electronic charge to the host to form a charge-transfer complex with the host. Non-limiting examples of organic molecules include bis(ethylenedithio)-tetrathiafulvalene (BEDT-TTF), tetrathiafulvalene (TTF), and their derivatives. In the case of polymeric hosts, the dopant is any of the above or also a material molecularly dispersed or copolymerized with the host as a minor component. Preferably, the n-type dopant in the n-type doped EIL includes Li, Na, K, Rb, Cs, Mg, Ca, Sr, Ba, La, Ce, Nd, Sm, Eu, Tb, Dy, or Yb, or combinations thereof. The n-type doped concentration is preferably in the range of 0.01-20% by volume of this layer.

In a one embodiment, the electron-injection layer contains a phenanthroline derivative doped with a metal. Suitable metals include Li, Na, K, Rb, Cs, Mg, Ca, Sr, Ba, La, Ce, Sm, Eu, Tb, Dy, or Yb with lithium being the most preferred. Suitable substituted phenanthrolines for this application include those according to formula (R), as described previously.

The thickness of the EIL is often in the range of from 0.1 nm to 20 nm, and typically in the range of from 1 nm to 5 nm.

Cathode

When light emission is viewed solely through the anode, the cathode 140 includes nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material includes a Mg:Ag alloy as described in U.S. Pat. No. 4,885,221. Another suitable class of cathode materials includes bilayers including a thin inorganic EIL in contact with an organic layer (e.g., organic EIL or ETL), which is capped with a thicker layer of a conductive metal. Here, the inorganic EIL preferably includes a low work function metal or metal salt and, if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862; and 6,140,763.

When light emission is viewed through the cathode, cathode 140 should be transparent or nearly transparent. For such applications, metals should be thin or one should use transparent conductive oxides, or include these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; and EP 1 076 368. Cathode materials are typically deposited by thermal evaporation, electron beam evaporation, ion sputtering, or chemical vapor deposition. When needed, patterning is achieved through many well known methods including, but not limited to, through-mask deposition, integral shadow masking, for example as described in U.S. Pat. No. 5,276,380 and EP 0 732 868, laser ablation, and selective chemical vapor deposition.

The thickness of the EIL is typically less than 20 nm, and preferably in the range of 10 nm or less.

Substrate

OLED is typically provided over a supporting substrate 110 where either the anode 120 or cathode 140 can be in contact with the substrate. The electrode in contact with the substrate is conveniently referred to as the bottom electrode. Conventionally, the bottom electrode is the anode 120, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure comprising multiple layers of materials. This is typically the case for active matrix substrates wherein TFTs are provided below the OLED layers. It is still necessary that the substrate, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate can be a complex structure comprising multiple layers of materials such as found in active matrix TFT designs. It is necessary to provide in these device configurations a light-transparent top electrode.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Organic materials useful in making OLEDs, for example organic hole-transporting materials, organic light-emitting materials doped with an organic electroluminescent components have relatively complex molecular structures with relatively weak molecular bonding forces, so that care should be taken to avoid decomposition of the organic material(s) during physical vapor deposition. The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

One preferred method for depositing the materials is described in US 2004/0255857 and U.S. Pat. No. 7,288,286 where different source evaporators are used to evaporate each of the materials. A second preferred method involves the use of flash evaporation where materials are metered along a material feed path in which the material feed path is temperature controlled. Such a preferred method is described in the following co-assigned patent application U.S. 2006/0177576 and co-assigned U.S. Pat. Nos. 7,232,588; 7,238,389; 7,288, 285; 7,288,286; and 7,165,340 Using this second method, each material can be evaporated using different source evaporators or the solid materials can be mixed prior to evaporation using the same source evaporator.

Encapsulation

Most OLED devices are sensitive to moisture or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

OLED Device Design Criteria

For full color display, the pixelation of LELs can be needed. This pixelated deposition of LELs is achieved using shadow masks, integral shadow masks, U.S. Pat. No. 5,294, 870, spatially defined thermal dye transfer from a donor sheet, U.S. Pat. Nos. 5,688,551; 5,851,709; and 6,066,357, and inkjet method, U.S. Pat. No. 6,066,357.

OLEDs of this invention can employ various well-known optical effects in order to enhance their emissive properties if desired. This includes optimizing layer thicknesses to yield improved light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings can be specifically provided over the OLED or as part of the OLED.

Embodiments of the invention can provide EL devices that have good luminance efficiency, good operational stability, excellent color and reduced drive voltages. Embodiments of the invention can also give reduced voltage rises over the lifetime of the devices and can be produced with high reproducibility and consistently to provide good light efficiency. They can have lower power consumption requirements and, when used with a battery, provide longer battery lifetimes.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

Experimental Results

EL devices 1-1 to 1-56 were constructed in the following manner:

1. A glass substrate, coated with an approximately 25 nm layer of indium-tin oxide (ITO) as the anode, was sequentially ultrasonicated in a commercial detergent, rinsed in deionized water and exposed to an oxygen plasma for about 1 minute.
2. Over the ITO a 1 nm fluorocarbon ($CF_x$) hole injecting layer ($1^{st}$ HIL) was deposited by plasma-assisted deposition of $CHF_3$ as described in U.S. Pat. No. 6,208,075.
3. A 10 nm layer of HAT-CN was then vacuum-deposited as a second electron-injection layer ($2^{nd}$ HIL).

4. Next, a hole transporting layer (HTL) of N,N'-di-1-naphthyl-N,N'-diphenyl-4,4'-diaminobiphenyl (NPB) was vacuum-deposited to a thickness of 105 nm.
5. A 40 nm light emitting layer consisting of a mixture of the host, emitter and stabilizer as indicated in Tables 1, 2 and 3 was then vacuum-deposited onto the HTL.
6. A first electron transporting layer (1st ETL) of P-1 having a thickness of 20 nm was vacuum-deposited over the LEL.
7. A second ETL (2nd ETL) of Bphen having a thickness of 10 nm was then vacuum-deposited over the 1st ETL.
8. Lithium fluoride (0.5 nm) was then vacuum-deposited onto the ETL, followed by a 100 nm layer of aluminum, to form a bilayer cathode.

The above sequence completed the deposition of the EL device. The device, together with a desiccant, was then hermetically packaged in a dry glove box for protection against the ambient environment. The cells thus formed were tested for efficiency and color at an operating current density of 20 mA/cm² and the results are reported in the form of luminous yield (cd/A), external quantum efficiency (EQE), and CIE (Commission Internationale de l'Eclairage) coordinates. EQE is given as a percent and is the ratio of photons of light that are emitted externally from the device to the number of electrons (or holes) injected into the OLED device. Devices were aged electrically at room temperature at current density of 80 mA/cm² in DC mode. The lifetime ($T_{50}$), or operational stability, of an OLED device is defined as the number of hours required for the luminance at 80 mA/cm² to drop to half the luminance of the fresh device. Table 1 is directed to variations in the stabilizer. Table 2 compares stabilizer variations. Table 3 compares variations in the diamino-substituted anthracene emitter.

TABLE 1

Stabilizer Variations

| Example | Host | Emitter | Stab. | cd/A | EQE | $CIE_x$ | $CIE_y$ | $T_{50}$ | $\lambda_{max}$ (nm) | BW (nm) |
|---|---|---|---|---|---|---|---|---|---|---|
| 1-1 (Comp) | P-1 | GEb-2 (5%) | none | 14.6 | 3.8 | 0.356 | 0.611 | 209 | 538 | 66.7 |
| 1-2 (Comp) | P-1 | none | QA-1 (0.6%) | 11.6 | 3.1 | 0.297 | 0.636 | 677 | 522 | 28.7 |
| 1-3 (Inv) | P-1 | GEb-2 (5%) | QA-1 (0.6%) | 16.9 | 4.4 | 0.364 | 0.609 | 931 | 531 | 71.4 |
| 1-4 (Comp) | P-1 | GEb-2 (10%) | none | 23.1 | 6.0 | 0.363 | 0.612 | 150 | 540 | 63.5 |
| 1-5 (Inv) | P-1 | GEb-2 (10%) | QA-1 (0.6%) | 19.4 | 5.0 | 0.376 | 0.603 | 895 | 542 | 70.9 |
| 1-6 (Comp) | P-1 | GEb-2 (15%) | none | 18.8 | 4.9 | 0.385 | 0.597 | 151 | 543 | 67.7 |
| 1-7 (Inv) | P-1 | GEb-2 (15%) | QA-1 (0.3%) | 22.8 | 5.9 | 0.374 | 0.604 | 805 | 541 | 67.2 |
| 1-8 (Inv) | P-1 | GEb-2 (15%) | QA-1 (0.6%) | 21.7 | 5.6 | 0.376 | 0.602 | 1220 | 542 | 69.0 |
| 1-9 (Comp) | P-1 | GEb-2 (25%) | none | 18.1 | 4.7 | 0.384 | 0.597 | 95 | 543 | 66.5 |
| 1-10 (Inv) | P-1 | GEb-2 (25%) | QA-1 (0.6%) | 20.7 | 5.6 | 0.375 | 0.606 | 771 | 543 | 67.6 |
| 1-11 (Comp) | P-1 | none | CBP (1%) | 3.7 | 2.5 | 0.15 | 0.19 | 51 | 470 | 76.8 |
| 1-12 (Comp) | P-1 | GEb-2 (5%) | CBP (1.0%) | 28.2 | 7.3 | 0.34 | 0.62 | 63 | 536 | 62.7 |
| 1-13 (Comp) | P-1 | none | Bphen (1%) | 3.6 | 2.5 | 0.15 | 0.19 | 38 | 469 | 75.5 |
| 1-14 (Comp) | P-1 | GEb-2 (5%) | Bphen (0.6%) | 22.9 | 5.9 | 0.34 | 0.62 | 73 | 536 | 61.9 |
| 1-15 (Comp) | P-1 | GEb-2 (5%) | Bphen (1.0%) | 23.2 | 6.0 | 0.34 | 0.62 | 57 | 536 | 61.9 |
| 1-16 (Comp) | P-1 | none | FD-30 (1%) | 18.6 | 5.5 | 0.262 | 0.621 | 107 | 504 | 66.3 |
| 1-4 (Comp) | P-1 | GEb-2 (10%) | none | 23.1 | 6.0 | 0.363 | 0.612 | 150 | 540 | 63.5 |
| 1-17 (Comp) | P-1 | GEb-2 (10%) | FD-30 (1%) | 25.8 | 6.7 | 0.362 | 0.611 | 216 | 540 | 63.5 |
| 1-9 (Comp) | P-1 | GEb-2 (25%) | none | 18.1 | 4.7 | 0.384 | 0.597 | 95 | 543 | 66.5 |
| 1-18 (Comp) | P-1 | GEb-2 (25%) | FD-30 (1%) | 24.8 | 6.4 | 0.367 | 0.609 | 279 | 541 | 63.2 |
| 1-19 (Comp) | P-1 | none | FD-39 (1%) | 7.86 | 3.5 | 0.568 | 0.427 | 1200 | 590 | 80.1 |
| 1-20 (Comp) | P-1 | GEb-2 (5%) | FD-39 (1.0%) | 9.37 | 4.0 | 0.562 | 0.436 | 2500 | 588 | 80.0 |
| 1-21 (Comp) | P-1 | none | FD-46 (1%) | 1.28 | 1.0 | 0.620 | 0.326 | 8000 | 609 | 25.2 |
| 1-22 (Comp) | P-1 | GEb-2 (5%) | FD-46 (1%) | 1.89 | 1.3 | 0.619 | 0.363 | 250 | 609 | 25.5 |
| 1-23 (Comp) | P-1 | none | FD-54 (1%) | 3.8 | 2.3 | 0.164 | 0.231 | 133 | 454 | 51.3 |
| 1-24 (Comp) | P-1 | GEb-1 (5%) | none | 17.2 | 5.1 | 0.263 | 0.623 | 370 | 516 | 64.2 |
| 1-25 (Comp | P-1 | GEb-1 (5%) | FD-54 (1%) | 17.9 | 5.1 | 0.291 | 0.617 | 358 | 520 | 71.7 |

TABLE 1-continued

Stabilizer Variations

| Example | Host | Emitter | Stab. | cd/A | EQE | CIE$_x$ | CIE$_y$ | T$_{50}$ | $\lambda_{max}$ (nm) | BW (nm) |
|---|---|---|---|---|---|---|---|---|---|---|
| 1-26 (Comp) | P-1 | GEb-1 (5%) | FD-54 (2%) | 16.7 | 4.8 | 0.292 | 0.618 | 386 | 520 | 71.9 |
| 1-27 (Comp) | P-1 | GEb-1 (5%) | FD-54 (3%) | 16.2 | 4.7 | 0.293 | 0.616 | 404 | 519 | 72.0 |
| 1-1 (Comp) | P-1 | GEb-2 (5%) | none | 14.6 | 3.8 | 0.356 | 0.611 | 209 | 538 | 66.7 |
| 1-28 (Comp) | P-1 | none | BSA-2 (4%) | 4.22 | 1.7 | 0.196 | 0.403 | 150 | 497 | 87.7 |
| 1-29 (Inv) | P-1 | GEb-2 (5%) | BSA-2 (2%) | 17.0 | 4.5 | 0.357 | 0.611 | 398 | 538 | 66.6 |
| 1-30 (Inv) | P-1 | GEb-2 (5%) | BSA-2 (4%) | 16.6 | 4.4 | 0.356 | 0.612 | 441 | 538 | 66.1 |
| 1-31 (Comp) | P-1 | none | FD-47 (2%) | 9.8 | 3.5 | 0.215 | 0.490 | 299 | 511 | 81.9 |
| 1-32 (Comp) | P-1 | GEb-2 (5%) | FD-47 (2%) | 17.9 | 4.7 | 0.358 | 0.609 | 623 | 538 | 67.3 |
| 1-33 (Comp) | P-1 | GEb-2 (5%) | FD-47 (4%) | 20.1 | 5.3 | 0.356 | 0.611 | 642 | 53.8 | 66.5 |

Figure 2:
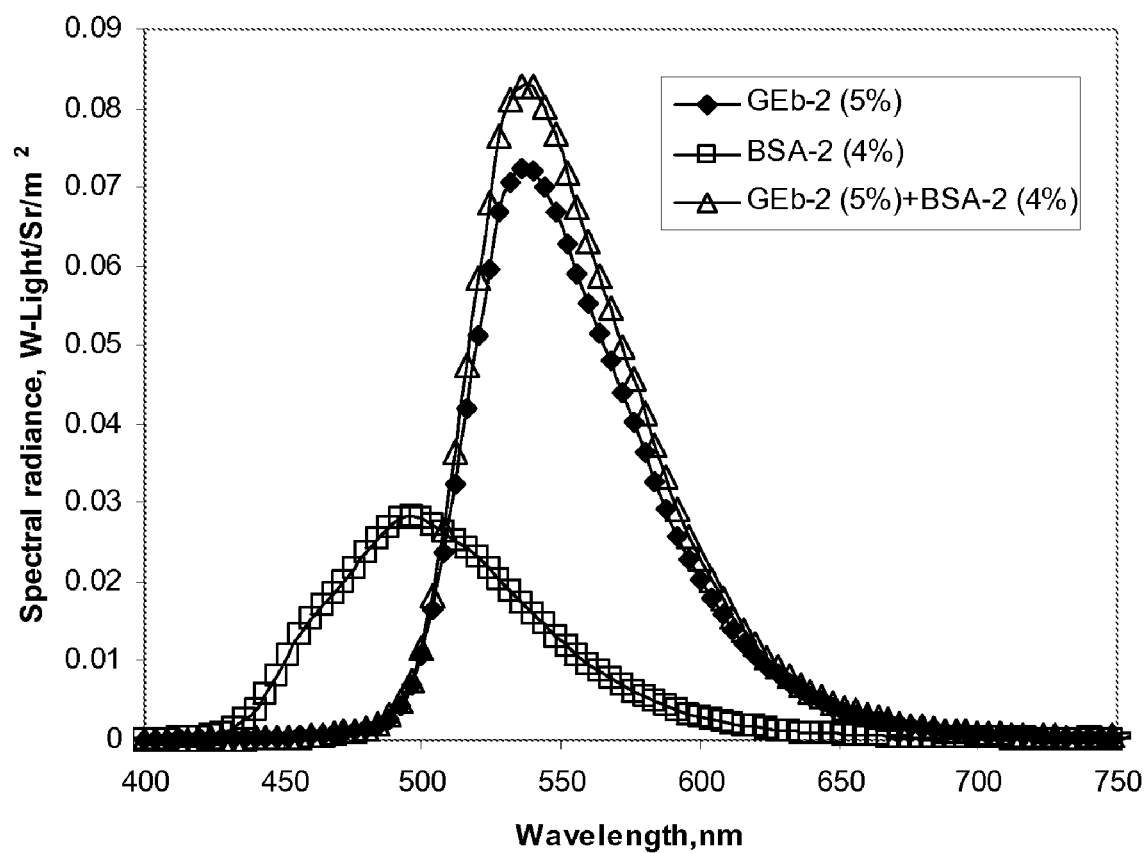
FIG. 2 shows EL spectra of OLED devices with light-emitting layer containing an anthracene host doped with GEb-2 or BSA-2 as emitters, and with a mixture of GEb-2 and BSA-2 where the BSA-2 acts as non-emitting stabilizer compound. Data are taken at 20 mA/cm² (examples 1-1, 1-28 and 1-30).
Figure 3:
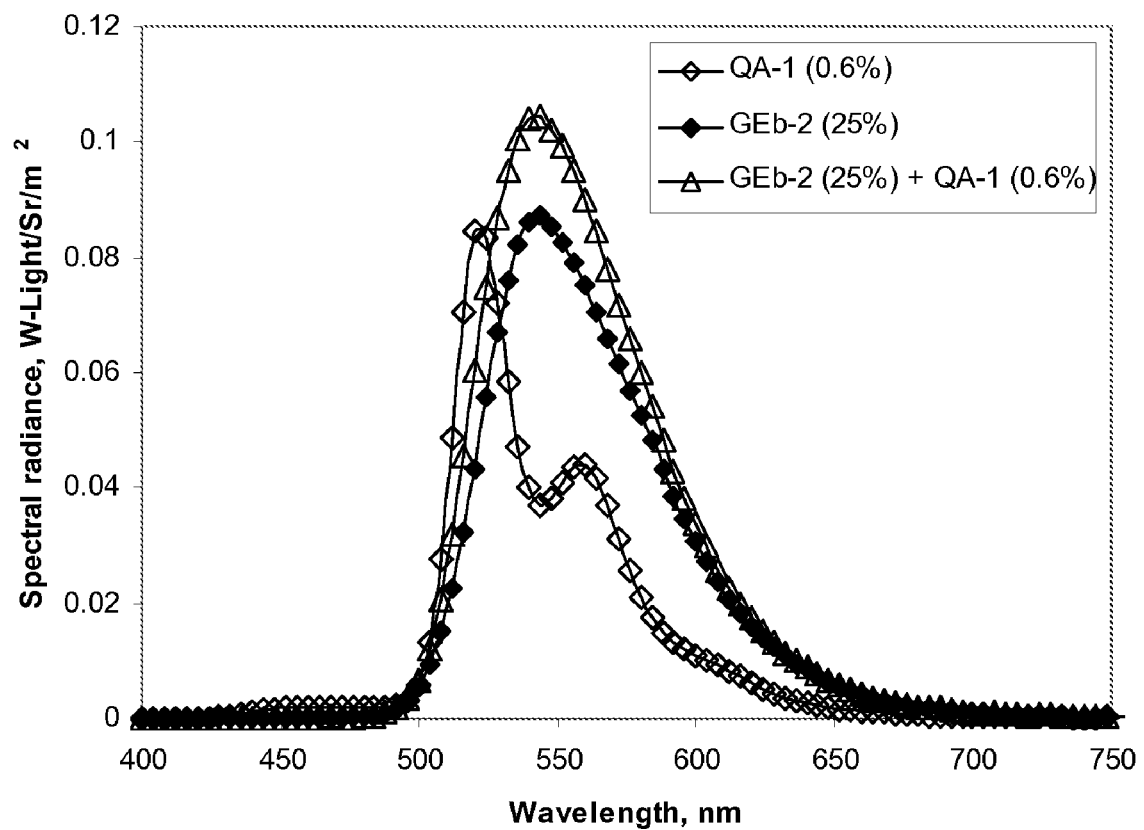
FIG. 3 shows EL spectra of devices with light-emitting layer containing an anthracene host doped with GEb-2 or QA-1 as emitters, and with a mixture of GEb-2 and QA-1 where the QA-1 acts as a non-emitting stabilizer compound. Data are taken at 20 mA/cm². (Examples 1-9, 1-2, 1-10.)

The results in Table 1 show that the addition of a quinacridone or a styrylamine compound to a combination of an anthracene host and a diarylamino-substituted 9,10-disubstituted anthracene emitter can unexpectedly provide a large improvement in stability as well as efficiency improvements. For example, compare the results with a quinacridone stabilizer in inventive sample 1-3, 1-5, 1-8 and 1-10 to comparative examples 1-1 and 1-2, 1-4, 1-6 and 1-9. In a similar manner, addition of a biphenylstyrylamine can also improve both stability and efficiency. For example, compare the results for inventive sample 1-30 to comparative samples 1-1 and 1-28. In both these cases, neither the quinacridone nor the biphenylstyrylamine affect the color significantly in terms of CIE$_{x,y}$ and while sometimes it is difficult to determine the magnitude of quinacridone emission, it is clear that the biphenylstyrylamine (which emits blue light as an emitter) is not emitting significant amounts of light (see FIG. 2). In contrast, these effects are not seen with other classes of materials. In particular, wide bandgap charge transporting materials (CBP and Bphen, see 1-11 to 1-15), a green dopant (FD-30, see 1-16 to 1-18), red dopants (FD-39 and FD-46, see 1-19 to 1-22), a boron-containing blue dopant (FD-54, see 1-23 to 1-27) or a styrylamine blue dopant (FD-47, see 1-31 to 1-33) all fail to provide significant improvements in stability and efficiency when added to the combination of an anthracene host and a diarylamino-substituted 9,10-disubstituted anthracene.

TABLE 2

Host variations

| Example | Host | Emitter | Stab. | cd/A | EQE | CIE$_x$ | CIE$_y$ | T$_{50}$ | $\lambda_{max}$ (nm) | BW (nm) |
|---|---|---|---|---|---|---|---|---|---|---|
| 1-1 (Comp) | P-1 | GEb-2 (5%) | none | 14.6 | 3.8 | 0.356 | 0.611 | 209 | 538 | 66.7 |
| 1-2 (Comp) | P-1 | none | QA-1 (0.6%) | 11.6 | 3.1 | 0.297 | 0.636 | 677 | 522 | 28.7 |
| 1-3 (Inv) | P-1 | GEb-2 (5%) | QA-1 (0.6%) | 16.9 | 4.4 | 0.364 | 0.609 | 931 | 531 | 71.4 |
| 1-34 (Comp) | Alq | GEb-2 (5%) | none | 9.7 | 2.7 | 0.406 | 0.574 | 1018 | 551 | 74.6 |
| 1-35 (Comp) | Alq | none | QA-1 (0.6%) | 12.6 | 3.2 | 0.317 | 0.647 | 422 | 528 | 29.0 |
| 1-36 (Comp) | Alq | GEb-2 (5%) | QA-1 (0.6%) | 10.6 | 2.9 | 0.410 | 0.580 | 1160 | 555 | 77.4 |
| 1-37 (Comp) | Alq | GEb-2 (5%) | QA-1 (2.0%) | 7.3 | 1.9 | 0.400 | 0.580 | 1342 | 534 | 76.1 |
| 1-38 (Comp) | Ga-1 | GEb-2 (5%) | none | 10.6 | 2.9 | 0.410 | 0.570 | 1 | 550 | 70.1 |
| 1-39 (Comp) | Ga-1 | none | QA-1 (0.6%) | 3.06 | 0.8 | 0.280 | 0.600 | 1 | 528 | 27.8 |
| 1-40 (Comp) | Ga-1 | GEb-2 (5%) | QA-1 (0.6%) | 2.20 | 0.6 | 0.398 | 0.584 | 0.25 | 539 | 74.6 |
| 1-41 (Comp) | Ga-1 | GEb-2 (5%) | QA-1 (2.0%) | 2.92 | 0.8 | 0.409 | 0.576 | 2 | 561 | 78.3 |
| 1-42 (Comp) | BAlq | GEb-2 (5%) | none | 12.4 | 3.3 | 0.370 | 0.590 | 65 | 542 | 67.5 |
| 1-43 (Comp) | BAlq | none | QA-1 (0.6%) | 7.5 | 2.0 | 0.280 | 0.630 | 20 | 523 | 26.2 |

TABLE 2-continued

Host variations

| Example | Host | Emitter | Stab. | cd/A | EQE | $CIE_x$ | $CIE_y$ | $T_{50}$ | $\lambda_{max}$ (nm) | BW (nm) |
|---|---|---|---|---|---|---|---|---|---|---|
| 1-44 (Comp) | BAlq | GEb-2 (5%) | QA-1 (0.6%) | 8.84 | 2.3 | 0.365 | 0.610 | 125 | 533 | 70.2 |
| 1-45 (Comp) | BAlq | GEb-2 (5%) | QA-1 (2.0%) | 5.39 | 1.4 | 0.382 | 0.600 | 100 | 529 | 76.1 |

The results in Table 2 show that utilization of other classes of known host materials does not result in the beneficial effects in stability and efficiency that are found with an anthracene host of the present invention.

TABLE 3

Diamino-substituted Anthracene Emitter Variations

| Example | Host | Emitter | Stab. | cd/A | EQE | $CIE_x$ | $CIE_y$ | $T_{50}$ | $\lambda_{max}$ (nm) | BW (nm) |
|---|---|---|---|---|---|---|---|---|---|---|
| 1-1 (Comp) | P-1 | GEb-2 (5%) | none | 14.6 | 3.8 | 0.356 | 0.611 | 209 | 538 | 66.7 |
| 1-2 (Comp) | P-1 | none | QA-1 (0.6%) | 11.6 | 3.1 | 0.297 | 0.636 | 677 | 522 | 28.7 |
| 1-3 (Inv) | P-1 | GEb-2 (5%) | QA-1 (0.6%) | 16.9 | 4.4 | 0.364 | 0.609 | 931 | 531 | 71.4 |
| 1-46 (Comp) | P-1 | GEb-1 (5%) | none | 17.2 | 5.1 | 0.263 | 0.623 | 370 | 516 | 64.2 |
| 1-47 (Inv) | P-1 | GEb-1 (5%) | QA-1 (0.6%) | 14.9 | 4.1 | 0.285 | 0.647 | 1187 | 521 | 33.1 |
| 1-48 (Comp) | P-1 | GEc-2 (2.5%) | none | 5.97 | 3.1 | 0.162 | 0.290 | 56 | 478 | 79.0 |
| 1-49 (Inv) | P-1 | GEc-2 (2.5%) | QA-1 (0.6%) | 14.0 | 3.8 | 0.278 | 0.628 | 540 | 521 | 27.8 |
| 1-50 (Comp) | P-1 | GEc-6 (2.5%) | none | 11.0 | 4.9 | 0.163 | 0.381 | 32 | 488 | 70.7 |
| 1-51 (Inv) | P-1 | GEc-6 (2.5%) | QA-1 (0.6%) | 15.9 | 4.6 | 0.249 | 0.605 | 336 | 521 | 27.8 |
| 1-16 (Comp) | P-1 | FD-30 (1%) | none | 18.6 | 5.5 | 0.262 | 0.621 | 107 | 504 | 66.3 |
| 1-2 (Comp) | P-1 | none | QA-1 (0.6%) | 11.6 | 3.1 | 0.297 | 0.636 | 677 | 522 | 28.7 |
| 1-52 (Comp) | P-1 | FD-30 (1%) | QA-1 (0.6%) | 15.9 | 4.4 | 0.277 | 0.644 | 531 | 521 | 49.1 |
| 1-53 (Comp) | P-1 | FD-30 (1%) | QA-1 (1.0%) | 13.0 | 3.4 | 0.308 | 0.640 | 1216 | 522 | 54.2 |
| 1-54 (Comp) | P-1 | FD-30 (1%) | FD-54 (0.6%) | 17.7 | 5.3 | 0.258 | 0.616 | 108 | 504 | 66 |
| 1-55 (Comp) | P-1 | FD-30 (1%) | FD-54 (1.0%) | 18.2 | 5.5 | 0.257 | 0.616 | 127 | 504 | 65.5 |
| 1-56 (Comp) | P-1 | FD-30 (1%) | FD-54 (2.0%) | 17.1 | 5.1 | 0.26 | 0.62 | 167 | 504 | 66.1 |

Comparative EL devices 2-1 to 2-6 were constructed in the following manner:

1. A glass substrate, coated with an approximately 25 nm layer of indium-tin oxide (ITO) as the anode, was sequentially ultrasonicated in a commercial detergent, rinsed in deionized water and exposed to an oxygen plasma for about 1 minute.

2. Over the ITO a 1 nm fluorocarbon ($CF_x$) hole injecting layer (1$^{st}$ HIL) was deposited by plasma-assisted deposition of $CHF_3$ as described in U.S. Pat. No. 6,208,075.

3. A 10 nm layer of HAT-CN was then vacuum-deposited as a second electron-injection layer (2$^{nd}$ HIL).

4. Next, a hole transporting layer (HTL) of N,N'-di-1-naphthyl-N,N'-diphenyl-4,4'-diaminobiphenyl (NPB) was vacuum-deposited to a thickness of 105 nm.

5. A 40 nm light emitting layer consisting of a mixture of the host, emitter: 2,6-bis(diphenylamino)-9-10-diphenylanthracene (BDPDPA), and stabilizer as indicated in Table 4 was then vacuum-deposited onto the HTL.

6. An electron transporting layer of ALQ having a thickness of 30 nm was vacuum-deposited over the LEL.

7. Lithium fluoride (0.5 nm) was then vacuum-deposited onto the ETL, followed by a 100 nm layer of aluminum, to form a bilayer cathode.

The above sequence completed the deposition of the EL device. The device, together with a desiccant, was then hermetically packaged in a dry glove box for protection against the ambient environment. The results are shown in Table 4.

TABLE 4

Diamino-substituted Anthracene Emitter Variations

| Example | Host | Emitter | Stab. | cd/A | EQE | $CIE_x$ | $CIE_y$ | $T_{50}$ | $\lambda_{max}$ (nm) | BW (nm) |
|---|---|---|---|---|---|---|---|---|---|---|
| 2-1 (Comp) | P-1 | BDPDPA (6%) | none | 18.8 | 5.11 | 0.279 | 0.653 | 1323 | 518 | 60 |
| 2-2 (Comp) | P-1 | BDPDPA (6%) | QA-1 (0.6%) | 16.3 | 4.33 | 0.287 | 0.657 | 1916 | 521 | 50 |
| 2-3 (Comp) | P-1 | BDPDPA (12%) | none | 19.5 | 5.28 | 0.280 | 0.656 | 1070 | 519 | 59 |
| 2-4 (Comp) | P-1 | BDPDPA (12%) | QA-1 (0.6%) | 15.3 | 4.06 | 0.294 | 0.654 | 1489 | 521 | 24 |
| 2-5 (Comp) | P-1 | BDPDPA (6%) | FD-54 | 18.7 | 5.09 | 0.279 | 0.653 | 1507 | 518 | 60 |
| 2-6 (Comp) | P-1 | BDPDPA (6%) | FD-47 (2%) | 20.9 | 5.68 | 0.277 | 0.655 | 1347 | 518 | 59 |

The results in Tables 3 and 4 demonstrate that only 9,10-diarylamino substituted anthracene emitters show large improvements in stability (and often efficiency as well) when used in combination with a quinacridone stabilizer and an anthracene host. Comparison of examples 1-49 to 1-48 and 1-51 to 1-50 indicate that the beneficial effect is still present when the diarylamino groups are substituted on substituents at the 9,10-position of the anthracene (according to Formula (1c) and do not need to be attached directly to the anthracene nucleus. The examples also show that a typical green dopant (FD-30, see example 1-54 compared to 1-2, 1-16 and 1-52 in Table 3) as well as a 2,6-diamino substituted anthracene (BD-PDPA; see examples 2-2 and 2-4 compared to 2-1 and 2-3 in Table 4) do not provide the benefits of the invention.

The invention has been described in detail with particular reference to certain preferred embodiments thereof, but it will be understood that variations and modifications can be effected within the spirit and scope of the invention.

Parts List

100 OLED
110 Substrate
120 Anode
130 Hole-Injecting layer (HIL)
132 Hole-Transporting layer (HTL)
134 Light-Emitting layer (LEL)
135 Hole-Blocking Layer (HBL)
136 Electron-Transporting layer (ETL)
138 Electron-Injecting layer (EIL)
140 Cathode
150 Voltage/Current Source
160 Electrical Connectors

The invention claimed is:

1. An OLED device comprising an anode, a cathode and a green light-emitting layer located therebetween, said light-emitting layer comprising:
   a) an anthracene host;
   b) a bis-diarylamine 9,10-substituted anthracene emitter according to Formula (1):

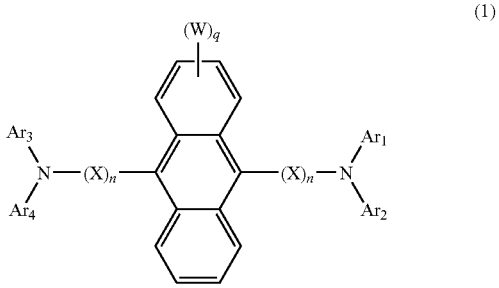

(1)

wherein:
X is an aryl group of 6 to 30 nucleus carbon atoms;
n is 0 or 1;
$Ar_1$, $Ar_2$, $Ar_3$ and $Ar_4$ each independently represent a substituted or unsubstituted aryl group of 6 to 30 nucleus carbon atoms where $Ar_1$ and $Ar_2$ or $Ar_3$ and $Ar_4$ can optionally be joined together;
W is an alkyl, aryl or heterocyclic group; and
q is an integer of 0 to 2; and
c) a stabilizer compound which is selected from a quinacridone or a biphenylstyrylamine.

2. The OLED device of claim 1 wherein n is 0 in the bis-diarylamine 9,10-substituted anthracene.

3. The OLED device of claim 2 wherein the bis-diarylamine 9,10-substituted anthracene is according to Formula (1b):

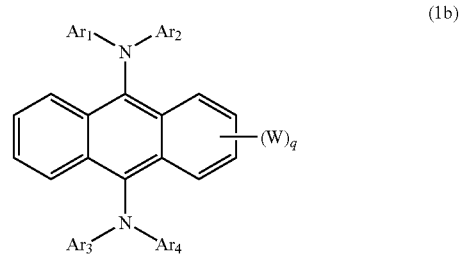

(1b)

wherein:
$Ar_1$, $Ar_2$, $Ar_3$ and $Ar_4$ each independently represent a substituted or unsubstituted aryl group of 6 to 10 nucleus carbon atoms where $Ar_1$ and $Ar_2$ or $Ar_3$ and $Ar_4$ can optionally be joined together;
W is an alkyl or aryl group; and
q is an integer of 0 to 2.

4. The OLED device of claim 3 wherein q is 0 and $Ar_1$, $Ar_2$, $Ar_3$ and $Ar_4$ are all individually substituted or unsubstituted phenyl or naphthyl groups.

5. The OLED device of claim 2 wherein the light emitting layer emits light with a $CIE_x$ coordinate in the range of 0.360-0.390 and a $CIE_y$ coordinate in the range of 0.600-0.610.

6. The OLED device of claim 1 wherein n is 1 in the bis-diarylamine 9,10-substituted anthracene.

7. The OLED device of claim 6 wherein the bis-diarylamine 9,10-substituted anthracene is according to Formula (1d):

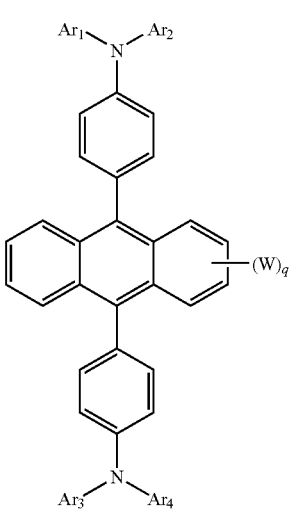

wherein:
$Ar_1$, $Ar_2$, $Ar_3$ and $Ar_4$ each independently represent a substituted or unsubstituted aryl group of 6 to 10 nucleus carbon atoms where $Ar_1$ and $Ar_2$ or $Ar_3$ and $Ar_4$ can optionally be joined together;
W is an alkyl or aryl group; and
q is an integer of 0 to 2.

8. The OLED device of claim 7 wherein the bis-diarylamine 9,10-substituted anthracene is according to Formula (1e):

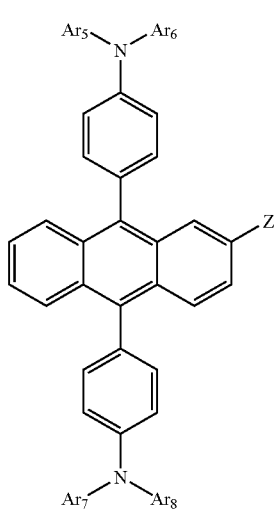

wherein:
$Ar_5$, $Ar_6$, $Ar_7$, $Ar_8$ are all individually substituted or unsubstituted phenyl or naphthyl; and
Z is hydrogen, alkyl, aryl, naphthyl or heterocyclic.

9. The OLED device of claim 6 wherein the light emitting layer emits light with a $CIE_x$ coordinate in the range of 0.250-0.300 and a $CIE_y$ coordinate in the range of 0.600-0.610.

10. The OLED device of claim 1 wherein the anthracene host is according to Formula (4):

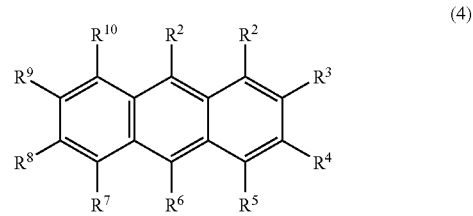

wherein:
$R^1$ and $R^6$ each independently represent an aryl group having 6-24 carbon atoms;
$R^2$-$R^5$ and $R^7$-$R^{10}$ are each independently chosen from hydrogen, alkyl groups from 1-24 carbon atoms or aromatic groups from 5-24 carbon atoms.

11. The OLED device of claim 10 wherein:
$R^1$ and $R^6$ each represent an independently selected phenyl group, biphenyl group, or naphthyl group;
$R^3$ represents hydrogen or an aromatic group from 6-24 carbon atom; and
$R^2$, $R^4$, $R^5$, $R^7$-$R^{10}$ represent hydrogen.

12. The OLED device of claim 1 wherein the stabilizer compound is a quinacridone according to Formula (2):

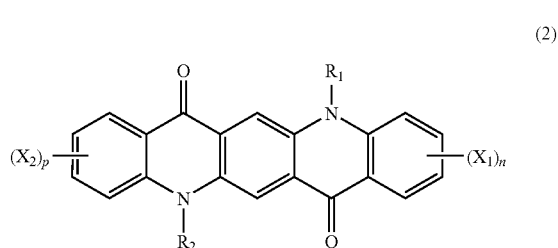

wherein:
$R_1$ and $R_2$ are each independently alkyl or aryl;
$X_1$ and $X_2$ are each independently halogen; and
n and p are each independently 0 to 4.

13. The OLED device of claim 12 wherein the quinacridone is chosen from:

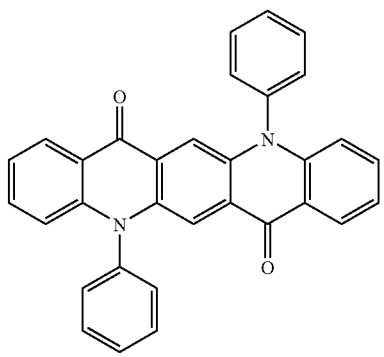

QA-1

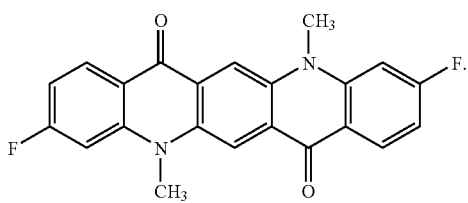

QA-2

14. The OLED device of claim 1 wherein the stabilizer compound is a biphenylstyrylamine according to Formula (3):

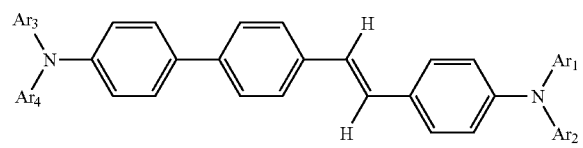

(3)

wherein:
Ar$_1$-Ar$_4$ are each independently an aryl group of 6 to 24 carbon atoms where Ar$_1$-Ar$_2$ and Ar$_3$-Ar$_4$ can be optionally joined together to form a ring system.

15. The OLED device of claim 14 where Ar1-Ar4 are each individually phenyl or alkyl substituted phenyl groups.

16. The OLED device of claim 15 wherein the biphenylstyrylamine is chosen from:

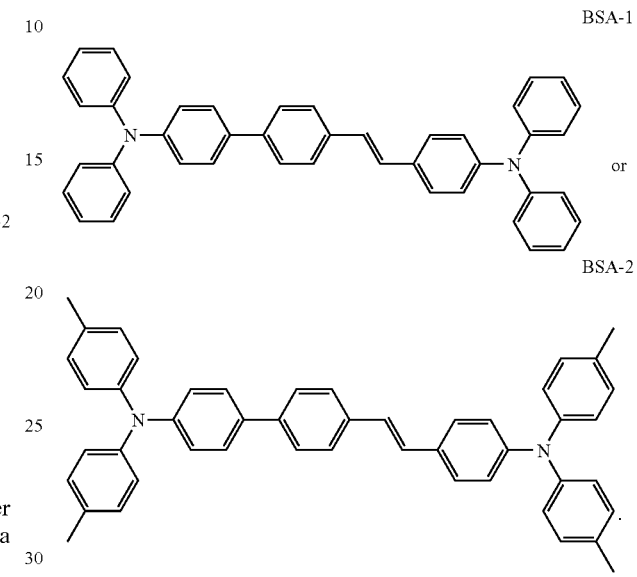

17. The OLED device of claim 1 wherein the light-emitting layer includes the bis-diarylamine 9,10-substituted anthracene in the range of 0.5-25% by volume and the stabilizer in the range of 0.5%-6% by volume.

18. The OLED device of claim 17 wherein the light-emitting layer includes the bis-diarylamine 9,10-substituted anthracene in the range of 3-15% by volume and the stabilizer in the range of 0.5%-6% by volume.

* * * * *